United States Patent [19]

Tsubai

[11] Patent Number: 5,793,312
[45] Date of Patent: Aug. 11, 1998

[54] DATA ENTRY SYSTEM

[76] Inventor: Ryozo Tsubai, 3637 W. Alabama, Suite 155, Houston, Tex. 77027

[21] Appl. No.: 838,700

[22] Filed: Apr. 9, 1997

[51] Int. Cl.$^6$ .......................... H03K 17/94; H03M 11/00
[52] U.S. Cl. ...................... 341/22; 345/168; 364/709.15; 364/709.16; 341/21; 341/20; 400/485
[58] Field of Search .................. 364/189, 709.12, 364/709.15, 709.16; 345/168; 341/20, 22, 26, 21, 23, 24, 25, 173, 176; 400/485

[56] References Cited

U.S. PATENT DOCUMENTS

| | | |
|---|---|---|
| 4,042,777 | 8/1977 | Bequaert et al. . |
| 4,099,246 | 7/1978 | Osborne et al. . |
| 4,344,069 | 8/1982 | Prame . |
| 4,443,789 | 4/1984 | Endfield et al. . |
| 4,547,860 | 10/1985 | Lapeyre . |
| 4,638,306 | 1/1987 | Rolhaus et al. . |
| 4,694,280 | 9/1987 | Rolhaus et al. . |
| 5,003,503 | 3/1991 | Lapeyre . |
| 5,062,070 | 10/1991 | Lapeyre ............... 364/709.16 |
| 5,189,416 | 2/1993 | Estes .......................... 341/26 |

OTHER PUBLICATIONS

Infogrip, Inc. BAT Personal Keyboard Sales Brochure (1994).

*Primary Examiner*—Brian Zimmerman
*Assistant Examiner*—Timothy Edwards, Jr.
*Attorney, Agent, or Firm*—Keeling Law Firm

[57] ABSTRACT

A data entry system for use with one hand that includes nine primary keys and four secondary keys. The nine primary keys are arranged in three symmetrical rows of three keys each and, thereby, form three symmetrical columns of three keys each. These primary keys are positioned and constructed for operation by the index finger, the middle finger, and the ring finger of a user. Two secondary keys are positioned proximal the primary keys so that when the user's hand is properly positioned on the keypad, the user's thumb is naturally proximal the thumb keys (for right hand use). Likewise, two secondary keys are positioned proximal the primary keys such that when the user's hand is properly positioned on the keypad, the user's pinky finger is naturally proximal the secondary key (for right hand use). For left handed users, the data entry system is also provided with a selector switch which inverts the characteristics of the two sets of secondary keys. Depending on whether a primary or a secondary key has been depressed and on whether two keys are concurrently depressed, the data entry system permits entry of a pre-programmed character or function at the release of one key, at the concurrent and non-sequential depression of one primary and one secondary key, or at the concurrent sequential depression of two primary or two secondary keys. Thereby, the thirteen key layout described provides for efficient, comprehensive data entry using one hand.

19 Claims, 11 Drawing Sheets

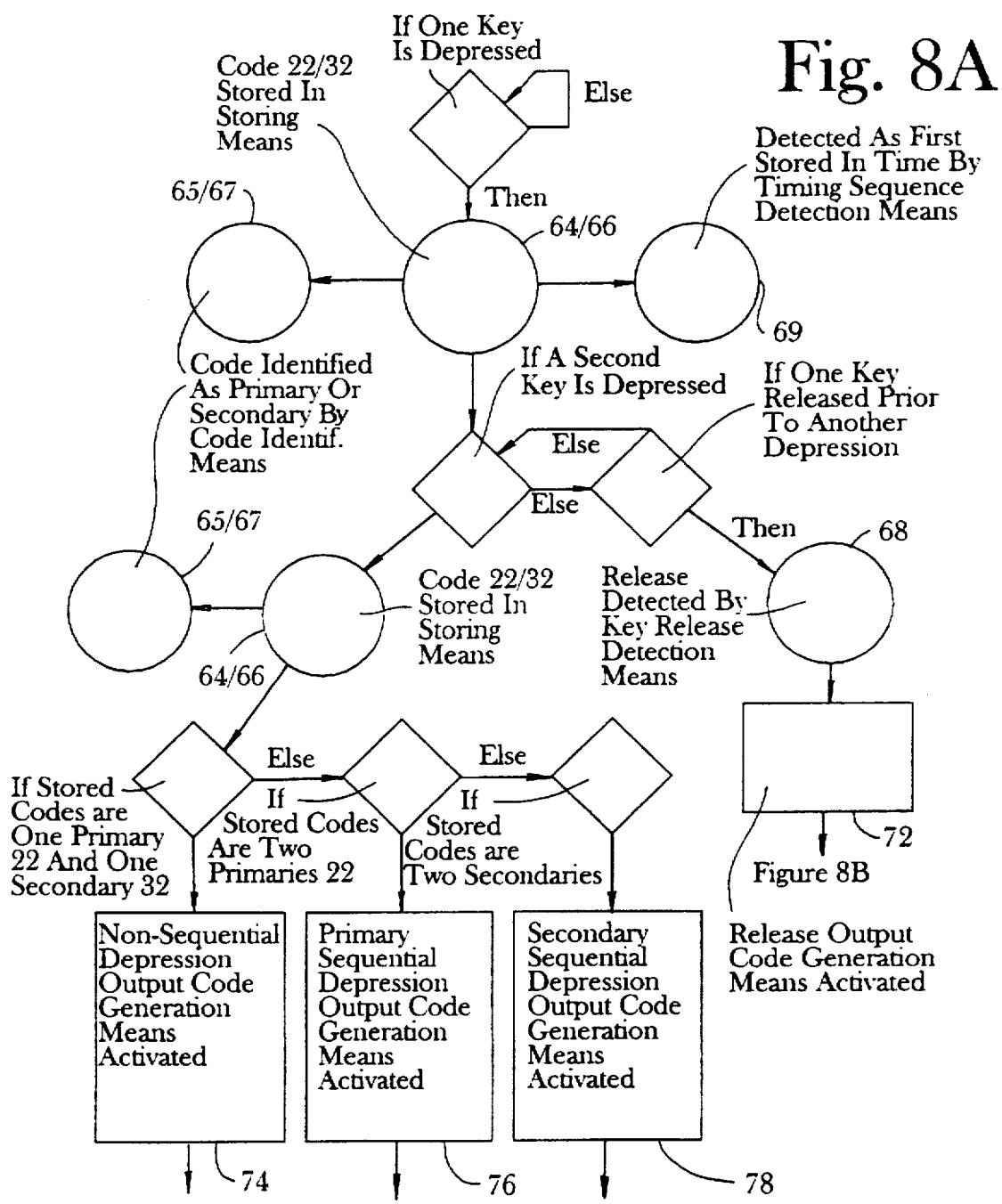

Fig. 9

| REGULAR MODE PRIMARY KEY | NO SECONDARY KEY DEPRESSED | SECONDARY KEY 160 | SECONDARY KEY 159 |
|---|---|---|---|
| 150 | a | x | q |
| 151 | r | b | m |
| 152 | w | j | p |
| 153 | e | k | u |
| 154 | h | f | s |
| 155 | t | c | d |
| 156 | o | , | i |
| 157 | l | v | n |
| 158 | y | z | g |

Fig. 10

| SHIFT MODE 91 PRIMARY KEY | NO SECONDARY KEY DEPRESSED | SECONDARY KEY 160 | SECONDARY KEY 159 |
|---|---|---|---|
| 150 | A | X | Q |
| 151 | R | B | M |
| 152 | W | J | P |
| 153 | E | K | U |
| 154 | H | F | S |
| 155 | T | C | D |
| 156 | O | , | I |
| 157 | L | V | N |
| 158 | Y | Z | G |

Fig. 11

| SYMBOL MODE 92 PRIMARY KEY | NO SECONDARY KEY DEPRESSED | SECONDARY KEY 160 | SECONDARY KEY 159 |
|---|---|---|---|
| 150 | @ | \ | ? |
| 151 | + | ' | = |
| 152 | ~ | \| | # |
| 153 | & | ; | / |
| 154 | _ | ^ | * |
| 155 | ! | : | - |
| 156 | ( | } | { |
| 157 | " | > | < |
| 158 | ) | ] | [ |

Fig. 12A

| NUMBER MODE 93 PRIMARY KEY | NO SECONDARY KEY DEPRESSED | SECONDARY KEY 160 | SECONDARY KEY 159 |
|---|---|---|---|
| 150 | 7 | END | HOME |
| 151 | 8 | + | - |
| 152 | 9 | INT | / |
| 153 | 4 | € | % |
| 154 | 5 | UP ARROW | PAGE UP |
| 155 | 6 | ③ | $ |
| 156 | 1 | LEFT ARROW | 0 |
| 157 | 2 | DOWN ARROW | PAGE DOWN |
| 158 | 3 | RIGHT ARROW | . |

Fig. 12B

| NUMBER MODE 93 PRIMARY KEY | SECONDARY KEY 162 | SECONDARY KEY 162 + 160 | SECONDARY KEY 162 + 159 |
|---|---|---|---|
| 150 | FUNCTION 1 | | |
| 151 | FUNCTION 2 | | |
| 152 | FUNCTION 3 | | |
| 153 | FUNCTION 4 | | |
| 154 | FUNCTION 5 | | |
| 155 | FUNCTION 6 | | |
| 156 | FUNCTION 7 | FUNCTION 11 | FUNCTION 10 |
| 157 | FUNCTION 8 | | FUNCTION 12 |
| 158 | FUNCTION 9 | | |

Fig. 13A

| | NO OTHER SECONDARY KEY | SECOND SECONDARY KEY 159 | SECOND SECONDARY KEY 160 |
|---|---|---|---|
| FIRST SECONDARY KEY 161 | ENTER | ALTERNATE | CONTROL |
| FIRST SECONDARY KEY 162 | (SPACE) | BACK SPACE | CAPS LOCK |

Fig. 13B

| | NO OTHER SECONDARY KEY | SECOND SECONDARY KEY 159 | SECOND SECONDARY KEY 160 |
|---|---|---|---|
| FIRST SECONDARY KEY 159 | DELETE | DELETE | |
| FIRST SECONDARY KEY 160 | NUMBER MODE | INSERT | ESCAPE |

DATA ENTRY SYSTEM

BACKGROUND OF THE INVENTION

FIELD OF THE INVENTION

This invention relates to a data entry system. More specifically, it is directed to an improved data entry system operated with one hand that utilizes fewer keys than a standard keyboard, provides comprehensive data entry including alphabetic and textual entry, and generates characters or functions for data entry in four ways: a release generation means, a non-sequential depression generation means, a primary sequential depression generation means, and a secondary sequential depression generation means.

Presently, data entry systems, such as keypads and keyboards, are used with a wide variety of devices including computers, typewriters, telephones, calculators, cash registers, data storage devices, etc. Typically, each key of a keyboard when depressed performs a single function. Keys can be made to perform more than one function, however, when depressed in combination with other keys. For example, a conventional key assigned to produce a small letter "a" may also produce a capital letter "A" when depressed in combination with a "shift" key. When depressed, these standard keys make a connection that completes a circuit. The connection, and completion of the circuit, sends a signal associated with the function assigned to that key. Because the conventional key sends the signal upon completion of the circuit, the user must depress the shift key before depressing the letter key to produce the desired capital letter. However, keys may also be made so that they perform more than one function when depressed in combination with other keys in a nonsequential order.

One problem associated with the limitation of each key performing only one function is that substantial space is required to provide all of the keys needed for comprehensive data entry that includes the capability of textual (or alphabetic) entry. To simply provide the alphabet and ten digits requires thirty-six keys in a standard keyboard. Additional keys are generally required for most data entry.

Each key must provide sufficient area for a finger to depress the key without inadvertently depressing other keys. Thus, keys have a minimum size to provide for efficient data entry. Because of the number of keys required for data entry, and the minimum size limitation of each key, data entry keyboards have a minimum functional size.

As the use of smaller, portable data entry devices and computing devices becomes more widespread, reducing the size of the data entry keyboard is important because conserving space and weight is a primary consideration in the design of the data entry devices. One of the major limiting factors in reducing the size of the data entry devices is the data entry keyboard space requirements.

A second problem with present data entry keyboards that have a great number of keys is that they require two hands to operate efficiently because the keys are widely spaced. Many people, however, are unable to use two hands for data entry due to handicap, injury, or the need to use one hand for another purpose during data entry. Also, utilizing both hands for data entry using keys hampers the use of other data entry devices such as a mouse, trackball, digitizer, etc. because one hand must be removed from the data entry keyboard to use the other data entry device. Thus, the requirement that the keyboard require two hands to operate creates inefficiency in many applications.

A third problem which arises in the development of keyboards for one-handed use is that, to a degree, the capability to enter a large number of characters and the pace at which such characters are entered depends on the number of keys of the keyboard. A greater number of keys usually provides a greater number of characters available for entry. And, a greater number of keys also diminishes the number of concurrent depressions necessary to enter single characters. Concurrent depression of two or more keys for one single entry reduces the pace at which a user utilizes the keyboard. For example, in order to enter the capital letter "A", a user is normally required to depress the "shift" key concurrently with the "a" key. It follows then that entry of the capital letter "A" would be more rapid if one single key were designated for its entry.

It would thus be beneficial to find an optimum balance between the number of keys and the rapidity of data entry provided for keyboards intended for one-handed use. Such a balance may be struck, as has been done by the Applicant in the present invention, by revising the methods by which the characters are entered into or registered by the keyboard.

RELATED ART

Keyboards consisting of a small number of keys are known in the prior art. Among others, one known type of keyboard, the "Chordal Keyboard", provides for one hand operation. Examples of "Chordal Keyboards" are U.S. Pat. No. 5,189,416 issued to Estes on Feb. 23, 1993 and U.S. Pat. No. 4,443,789 issued to Endfield on Apr. 17, 1984.

U.S. Pat. No. 5,189,416 issued to Estes discloses a chordal keyboard method and apparatus which includes a plurality of keys and a first and second set of registers. The keys are depressed and a controller detects the depression and sets corresponding symbol locations in the first and second set of registers. When the keys are released, the controller detects the release and clears the corresponding symbol location from the second set of registers. The controller then detects when all of the keys are in the release position, and upon doing so, the controller generates a key code corresponding to symbol locations set in the first set of registers. Thus, the key code is not generated until all keys which determine the "chord" or combination of depressions are released. The "chordal" input method is thus relatively slow.

In general, because of the low number of keys used in "chordal keyboards", data entry using the keyboard requires depression of a number of keys at one time. The user must learn a complicated system of "chords" to operate the keyboard. Each "chord" represents one character. Simply typing the alphabet in lower case letters requires the simultaneous depression of between one to five keys at once. For example, the chord that produces an "a" requires depression of four keys simultaneously, "b" through "d" require two keys, "e" requires three keys, etc. In the known keyboard, each combination must be completed before the subsequent combination is executed. Attempting to begin a new chord before the previous chord is fully released results in the entry of a combination of the chords. Therefore, the system is relatively slow.

It would thus be a great benefit to provide a keyboard for one-handed use with the capability of entering data at a faster and more efficient pace than those one-handed keyboards presently known in the prior art.

SUMMARY OF THE INVENTION

Accordingly, the objectives of this invention are to provide, inter alia, a Data Entry System that:

reduces the number of keys required for a data entry keyboard;

reduces the space required for a data entry keyboard;

permits comprehensive data entry including textual entry and alphabetic entry;

provides efficient data entry using only one hand;

provides a faster date entry method than known "chordal" keyboards;

reduces the cost of keyboards by reducing the number of parts and the material required;

permits entry of the alphabet wherein each letter requires depression of only one key or two keys simultaneously;

utilizes the standard nine key layout to take advantage of the its familiarity with the public and its ergonomic use of finger movements;

provides a key layout that maximizes economy of finger movements;

provides either right hand or left hand operation;

utilizes simple keystroke combinations to enhance ease of learning and use;

permits variation of functions from a single keystroke;

strikes an optimum balance between the number of keys of a keyboard and the rapidity of data entry provided for keyboards intended for one-handed use; and generates characters and functions for data entry in four ways depending on which keys are depressed and released.

Other objects of the invention will become apparent from time to time throughout the specification and claims as hereinafter related.

To achieve such improvements, my invention is a data entry system that, in the preferred embodiment, includes nine primary keys and four secondary keys. The nine primary keys are arranged in three symmetrical rows of three keys each and, thereby, form three symmetrical columns of three keys each. These primary keys are ergonomically positioned and constructed for operation by the index finger, the middle finger, and the ring finger of a user. Two secondary keys are positioned proximal the primary keys so that when the user's hand is properly positioned on the keypad, the user's thumb is naturally proximal the thumb keys (for right hand use). Likewise, two secondary keys are positioned proximal the primary keys such that when the user's hand is properly positioned on the keypad, the user's pinky finger is naturally proximal the secondary key (for right hand use). For left handed users, the data entry system is also provided with a selector switch which inverts the characteristics of the two sets of secondary keys. Depending on whether a primary or a secondary key has been depressed and on whether two keys are concurrently depressed, the data entry system permits entry of a preprogrammed character or function at the release of one key, at the concurrent and non-sequential depression of two keys, or at the concurrent sequential depression of two keys. Thereby, the thirteen key layout described provides for efficient, comprehensive data entry using one hand.

BRIEF DESCRIPTION OF THE DRAWING

The manner in which these objectives and other desirable characteristics can be obtained is explained in the following description and attached drawings in which:

FIG. 8A is a detailed logic circuit diagram of the data entry system up to the output code generation means.

FIG. 9 is a table of character and function generation in the regular mode of the data entry system.

FIG. 10 is a table of character and function generation in the shift mode of the data entry system.

FIG. 11 is a table of character and function generation in the symbol mode of the data entry system.

FIG. 12A is a table of character and function generation in the number mode of the data entry system.

FIG. 12B is a table of character and function generation in the number mode of the data entry system.

FIG. 13A is a table of character and function generation in the regular mode of the data entry system.

FIG. 13B is a table of character and function generation in the regular mode of the data entry system.

DETAILED DESCRIPTION OF THE INVENTION

Figure 1:
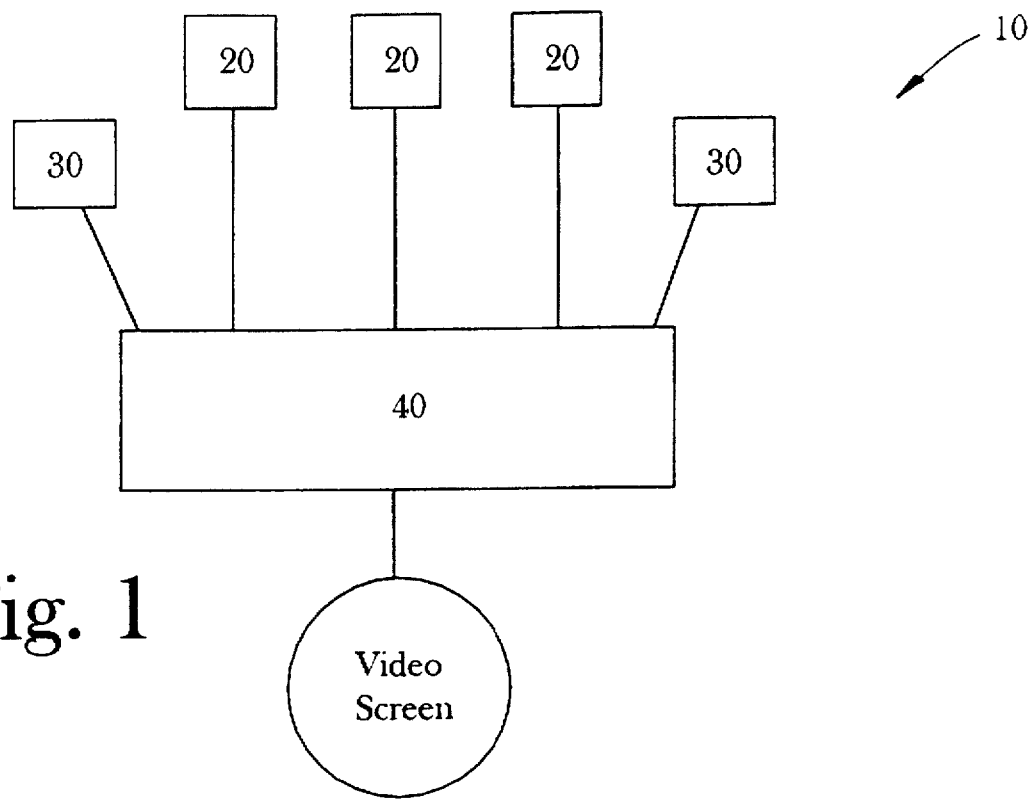
FIG. 1 is an overall schematic of the data entry system, including primary keys, secondary keys, controller, and video screen.

The preferred embodiment of my invention is shown in FIGS. 1 through 13B and the improved data entry system is depicted as 10. Generally, as shown in FIG. 1 the data entry system 10 comprises a plurality of primary keys 20, at least one secondary key 30, and a controller 40.

Data entry system 10 functions to generate output codes 12. Each output code 12 corresponds to a particular character 14 or function 15 so that, upon generation of a particular output code 12, the character 14 which corresponds to that particular output code 12 appears on the video screen attached to data entry system 10 or the function 15 which corresponds to that particular output code 12 is performed.

Upon depression, each of the plurality of primary keys 20 generates a distinct primary code 22. Likewise, upon depression, each of the at least one secondary key 30 generates a distinct secondary code 32. The keys, 20 and 30, generate the codes, 22 and 32, until the codes, 22 and 32, are subsequently canceled by controller 40, as described herein.

Upon generation of a primary code 22, controller 40 reads and stores the primary code 22 generated, if primary code 22 is one of the first two codes, 22 or 32, concurrently read in time by controller 40. Likewise, upon generation of a secondary code 32, controller 40 reads and stores the secondary code 32 generated, if secondary code 32 is one of the first two codes, 22 or 32, concurrently read in time by controller 40.

Each of the primary and secondary codes, 22 and 32, is distinct from all other codes, 22 and 32, and is represented by a binary code commonly used by computer programs. Furthermore, the codes, 22 and 32, must be preselected so that any summation of one of the primary codes 22 with one of the secondary codes 32 or any summation of two of the secondary codes 32 generates a combined code 34 which itself is distinct from all individual primary codes 22 and secondary codes 32 and from all other such summations.

Figure 2:
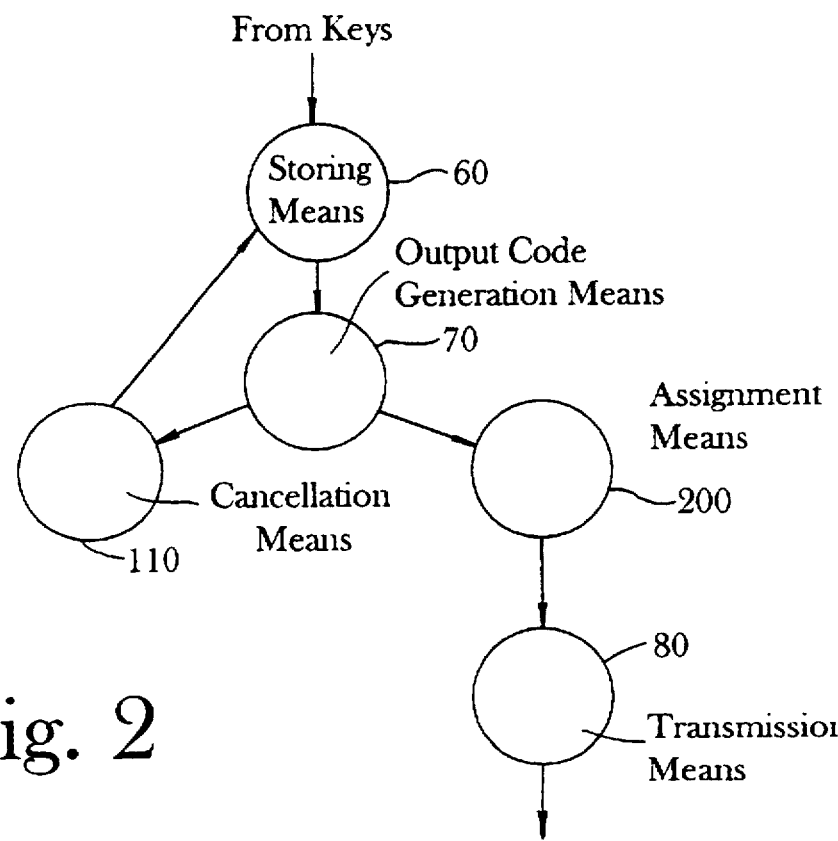
FIG. 2 is an overall schematic and logic flow diagram of the controller.

In general, the function of the controller 40 is to generate output code 12 based on the primary codes 22 and secondary codes 32 generated by the depression of plurality of primary keys 20 and the depression of at least one secondary key 30. The controller 40 comprises a storing means 60, an output code generation means 70, a cancellation means 110, an assignment means 200, and a transmission means 80. The overall logic circuit arrangement of controller 40 is shown in FIG. 2.

Storing means 60 stores the primary codes 22 generated by the depression of the plurality of primary keys 20 and the secondary codes 32 generated by the depression of the at least one secondary key 30. It is imperative that storing means 60 be able to distinguish between primary codes 22 and secondary codes 32. It is equally as important that storing means 60 be able to store only one or two of the primary and secondary codes, 22 and 32, at one time. Thus, storing means 60 has the capability of storing only two codes, 22 or 32, at once, usually corresponding to the codes, 22 or 32, generated by the first two keys, 20 or 30, which are concurrently depressed by the user.

Storing means 60 must also be able to distinguish which code, 22 or 32, is stored first in time and which code, 22 or 32, is stored second in time, if two codes, 22 or 32, are concurrently stored. It must also be understood that if, at any point in time, storing means 60 stores only one code, 22 or 32, then storing means 60 will consider that code, 22 or 32, to be the code stored first in time. This circumstance may occur if only one code, 22 or 32, is concurrently generated by the keys, 20 and 30, or if one of two codes, 22 or 32, generated is subsequently canceled by cancellation means 110, as will be described herein, thereby leaving only one code, 22 or 32, being stored by storing means 60.

Storing means 60 comprises a first storing means 64, a first code identification means 65, a second storing means 66, a second code identification means 67, a key release detection means 68, and a timing sequence detection means 69.

Figure 3:
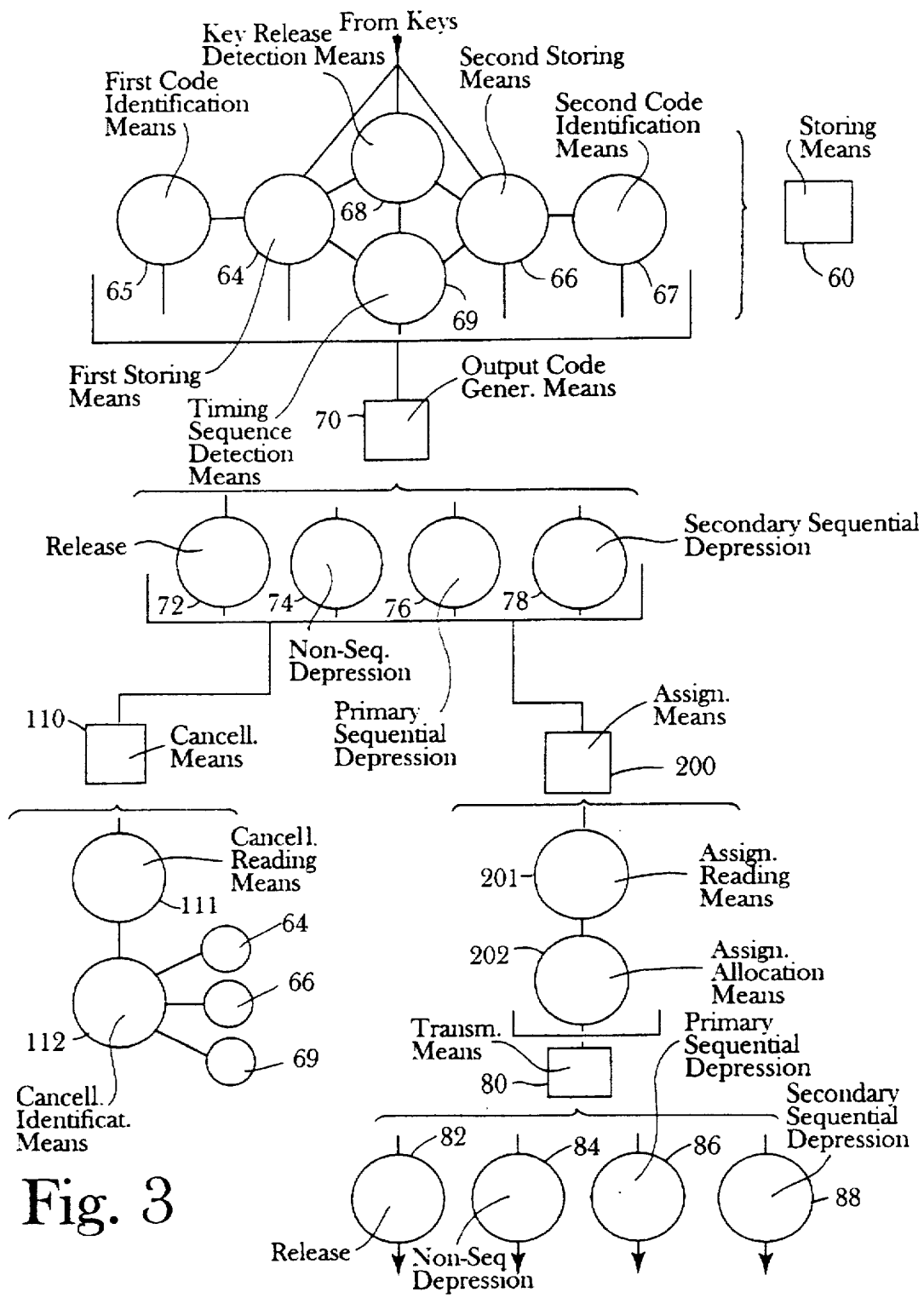
FIG. 3 is a diagram of electrical communication of the components of the data entry system.

The electrical communication between components of the controller 40 is shown in FIG. 3. The logic circuit involving the components of controller 40 is shown in FIGS. 8A–8E.

First storing means 64 stores the code, 22 or 32, generated by the key, 20 or 30, which is depressed by a user. Upon its generation, the code, 22 and/or 32, is stored in first storing means 64 until first storing means 64 receives an electrical signal from cancellation means 110 to cancel and clear the stored code, 22 or 32. First storing means 64, in a preferred embodiment, is a first register capable of storing a binary code.

Likewise, second storing means 66 stores the code, 22 or 32, generated by the key, 20 or 30, depressed by a user. Upon its generation, the code, 22 or 32, is stored in second storing means 66 until second storing means 66 receives an electrical signal from cancellation means 110 to cancel and clear the stored code, 22 or 32. Second storing means 66, in a preferred embodiment, is a second register 122 capable of storing a binary code.

If neither first nor second storing means, 64 and 66, store a code, 22 or 32, then first storing means 64 stores the first code, 22 or 32, generated first in time by the user, and second storing means 66 is not activated until the concurrent depression of another key, 20 or 30. However, if either first or second storing means, 64 and 66, have already stored a code, 22 or 32, then any other code, 22 or 32, concurrently generated by the user is stored by the storing means, 64 or 66, not already reading a code, 22 or 32.

First code identification means 65 is activated at the moment first storing means 64 stores a code, 22 or 32. First code identification means 65 is in electrical communication with first storing means 64. First code identification means 65 immediately identifies whether the code, 22 or 32, stored by first storing means 64 is a primary code 22 or a secondary code 32. In a preferred embodiment, first code identification means 65 is a logic circuit, cpu, or computer program capable of distinguishing between a primary code 22 and a secondary code 32.

Second code identification means 67 is activated at the moment second storing means 66 stores a code, 22 or 32. Second code identification means 67 is in electrical communication with second storing means 66. Second code identification means 67 immediately identifies whether the code, 22 or 32, stored by second storing means 66 is a primary code 22 or a secondary code 32. In a preferred embodiment, second code identification means 67 is a logic circuit, cpu, or computer program capable of distinguishing between a primary code 22 and a secondary code 32.

Key release detection means 68 is activated and detects when only one code, 22 or 32, is stored by first and second storing means, 64 and 66, and, subsequently, the key, 20 or 30, generating the only code, 22 or 32, stored by first and second storing means, 64 and 66, is released prior to another code, 22 or 32, being stored by first and second storing means, 64 and 66. It must be understood that key release detection means 68 will also be activated if cancellation means 110 cancels one of two codes, 22 or 32, being stored by first and second storing means, 64 and 66, and subsequently the key, 20 or 30, generating the remaining code, 22 or 32, being stored by first and second storing means, 64 and 66, is also released. Key release detection means 68 is in electrical communication with first and second storing means, 64 and 66. In a preferred embodiment, key release detection means 68 is a logic circuit, computer program, or cpu capable of detecting when only one code, 22 or 32, is stored by first and second storing means, 64 and 66, and, subsequently, the key, 20 or 30, generating the only code, 22 or 32, stored by first and second storing means, 64 and 66, is released prior to another code, 22 or 32, being stored by first and second storing means, 64 and 66.

Timing sequence detection means 69 detects which code, 22 or 32, was stored first in time by first and second storing means, 64 and 66. Timing sequence detection means 69 is in electrical communication with first and second storing means, 64 and 66. Initially, first storing means 64 will store the code, 22 or 32, stored first in time. However, if both first and second storing means, 64 and 66, store a code, 22 or 32, and the code, 22 or 32, being stored by first storing means 64 is subsequently canceled by cancellation means 110, then second storing means 66 is the only storing means, 64 and 66, which is storing a code, 22 or 32. In this case, timing sequence detection means 69 detects that the code, 22 or 32, stored by second storing means 66 is the code, 22 or 32, stored first in time in relation to any other subsequent and concurrent depression. Likewise, if cancellation means 110 cancels the generation of the code, 22 or 32, stored by second storing means 66, then timing sequence detection means 69 detects that the code, 22 or 32, stored by first storing means 64 is the code, 22 or 32, stored first in time in relation to any other subsequent and concurrent depression. Timing sequence detection means 69 thus keeps track of which storing means, 64 or 66, is presently storing the code, 22 or 32, stored first in time by controller 40. In a preferred embodiment, timing sequence detection means 69 is a logic circuit, cpu, or computer program capable of distinguishing which storing means, 64 or 66, is storing the code, 22 or 32, stored first in time.

Storing means 60 is in electrical communication with output code generation means 70 so that storing means 60 communicates to output code generation means 70 the information received and generated by first and second storing means, 64 and 66, first and second code identification means, 65 and 67, key release detection means 68, and timing sequence detection means 69. Storing means 60 is also in electrical communication with cancellation means 110 so that cancellation means 110 communicates to storing means 60, specifically first and second storing means, 64 and 66, the information received and generated by cancellation means 110.

Output code generation means 70 generates output code 12 based on information received and generated by storing means 60. More specifically, output code generation means 70 assigns a value to output code 12 based on whether key release detection means 68 is activated, on which code, 22 and 32, was stored first in time as detected by timing sequence generation means 69, and on which codes, 22 and 32, have been stored by first and second storing means, 64 and 66.

Output code generation means 70 comprises a release output code generation means 72, a non-sequential depression output code generation means 74, a primary sequential depression output code generation means 76, and a secondary sequential depression output code generation means 78. The output code generation means, 72, 74, 76, or 78 activated will depend on whether key release detection means 68 is activated and on which codes, 22 and 32, have been stored by first and second storing means, 64 and 66.

Release output code generation means 72 is activated if key release detection means 68 is activated. Release output code generation means 72 is in electrical communication with first and second storing means, 64 and 66, first and second code identification means, 65 and 67, and key release detection means 68. If release output code generation means 72 is activated, then release output code generation means 72 generates an output code 12 with a value equivalent to the only code, 22 or 32, stored by first and second storing means, 64 and 66. It should be noted that if key release detection means 68 is activated, then first and second storing means 64 must have stored only one code, 22 or 32, between the two. In a preferred embodiment, release output code generation means 72 is a logic circuit, cpu, or computer program capable of assigning output code 12 a value equivalent to the only code, 22 or 32, stored by first and second storing means, 64 and 66.

Non-sequential depression output code generation means 74 is activated if first and second code identification means, 65 and 67, identify that first and second storing means, 64 and 66, have stored one primary code 22 and one secondary code 32 and if key release detection means 68 has not been activated. Non-sequential depression output code generation means 74 is in electrical communication with first and second storing means, 64 and 66, first and second code identification means, 65 and 67, and key release detection means 68. If non-sequential depression output code generation means 74 is activated, then non-sequential depression output code generation means 74 generates an output code 12 with a value equivalent to the sum of the primary code 22 and the secondary code 32 stored by first and second storing means, 64 and 66. As previously disclosed, such sum is referred to as a combined code 34. In a preferred embodiment, non-sequential depression output code generation means 74 is a logic circuit, cpu, or computer program capable of assigning output code 12 a value equivalent to the sum of the primary code 22 and the secondary code 32 stored by first and second storing means, 64 and 66.

Primary sequential depression output code generation means 76 is activated if first and second code identification means, 65 and 67, identify that first and second storing means, 64 and 66, have each stored one primary code 22 and if key release detection means 68 has not been activated. Primary sequential depression output code generation means 76 is in electrical communication with first and second storing means, 64 and 66, first and second code identification means, 65 and 67, key release detection means 68, and timing sequence detection means 69. If primary sequential depression output code generation means 76 is activated, then primary sequential depression output code generation means 76 generates an output code 12 with a value equivalent to the primary code 22 stored first in time by first and second storing means, 64 or 66, as presently detected by timing sequence detection means 69. In a preferred embodiment, primary sequential depression output code generation means 76 is a logic circuit, cpu, or computer program capable of assigning output code 12 a value equivalent to the primary code 22 stored first in time by first and second storing means, 64 or 66, as detected by timing sequence detection means 69.

Secondary sequential depression output code generation means 78 is activated if first and second code identification means, 65 and 67, identify that first and second storing means, 64 and 66, have each stored one secondary code 32 and if key release detection means 68 has not been activated. Secondary sequential depression output code generation means 78 is in electrical communication with first and second storing means, 64 and 66, first and second code identification means, 65 and 67, key release detection means 68, and timing sequence detection means 69. If secondary sequential depression output code generation means 78 is activated, then secondary sequential depression output code generation means 78 generates an output code 12 with a value equivalent to the sum of the two secondary codes 32 stored by first and second storing means, 64 and 66. As previously disclosed, such sum is referred to as a combined code 34. In a preferred embodiment, secondary sequential depression output code generation means 78 is a logic circuit, cpu, or computer program capable of assigning output code 12 a value equivalent to the sum of the two secondary codes 32 stored by first and second storing means, 64 and 66.

Cancellation means 110 is activated upon the generation of an output code 12 by output code generation means 70. Cancellation means 110 is in electrical communication with storing means 60 and output code generation means 70.

Cancellation means 110 comprises a cancellation reading means 111 and a cancellation identification means 112.

Cancellation reading means 111 reads the output code 12 generated by output code generation means 70. Cancellation reading means 111 is in electrical communication with each of the output code generation means 72, 74, 76, and 78. In a preferred embodiment, cancellation reading means 111 is a third register capable of storing a binary code.

Cancellation identification means 112 identifies which of the codes, 22 or 32, currently stored in first and second storing means, 64 and 66, was determinative in the generation of the output code 12 read by cancellation reading means 111. Thus, cancellation identification means 112 is in electrical communication with cancellation reading means 111.

For purposes of clarity and brevity, the code, 22 or 32, identified by cancellation identification means 112 as the determinative code, 22 or 32, in the generation of the output code 12 will hereinafter be referred to as the determinative code 36. Once cancellation identification means 112 identifies the determinative code 36, cancellation identification means 112 cancels the determinative code 36 from the first or second storing means, 64 or 66, which is storing the determinative code 36. Cancellation identification means 112 is in electrical communication with first and second storing means, 64 and 66, as well as timing sequence detection means 69.

Cancellation identification means 112 identifies the determinative code 36 depending on which output code generation means, 72, 74, 76, or 78 is activated. In a preferred embodiment, cancellation identification means 112 is a logic circuit, cpu, or computer program capable of identifying the determinative code 36 of output code 12 depending on which output code generation means, 72, 74, 76, or 78, was activated, and canceling the determinative code 36 from whichever storing means, 64 or 66, is storing the determinative code 36. It is also necessary that cancellation means 110 be able to distinguish between a primary code 22 and a secondary code 32.

If release depression output code generation means 72 is activated, then cancellation identification means 112 identifies that the determinative code 36 is the only code, 22 or 32, being stored by first and second storing means, 64 and 66. Once identified, cancellation identification means 112 cancels the code, 22 or 32, (the determinative code 36) from whichever storing means, 64 or 66, is storing determinative code 36.

If non-sequential depression output code generation means 74 is activated, then cancellation identification means 112 identifies that the determinative code 36 is either the primary code 22 or the secondary code 32 stored by first and second storing means, 64 and 66, and identified as such by first and second code identification means, 65 and 67. In this case, cancellation means 112 must be pre-programmed so that it identifies determinative code 36 as being either the primary code 22 or the secondary code 32. Whether primary code 22 or secondary code 32 is identified as the determinative code 36 depends on the needs of the user. Once identified, cancellation identification means 112 cancels the code, 22 or 32, (the determinative code 36) from whichever storing means, 64 or 66, is storing the determinative code 36.

If primary sequential depression output code generation means 76 is activated, then cancellation identification means 112 identifies that the determinative code 36 is the primary code 22 stored first in time by either first or second storing means, 64 or 66, as detected by timing sequence detection means 69. Once identified, cancellation identification means 112 cancels the primary code 22 stored first in time (the determinative code 36) from whichever storing means, 64 or 66, is storing determinative code 36.

If secondary sequential depression output code generation means 78 is activated, then cancellation identification means 112 identifies that the determinative code 36 is the secondary code 32 stored first in time by first and second storing means, 64 or 66, as detected by timing sequence detection means 69. Once identified, cancellation identification means 112 cancels the secondary code 32 stored first in time (the determinative code 36) from whichever storing means, 64 and 66, is storing determinative code 36.

Output code generation means 70 is also in electrical communication with assignment means 200 so that the generation of output code 12 by output code generation means 70 activates assignment means 200. Assignment means 200 comprises an assignment reading means 201 and a assignment allocation means 202.

Assignment reading means 201 reads the output code 12 generated by output code generation means 70. Assignment reading means 201 is in electrical communication with each of the output code generation means 72, 74, 76, and 78. In a preferred embodiment, assignment reading means 201 is a fourth register capable of reading a binary code.

Assignment allocation means 202 is in electrical communication with assignment reading means 201. Assignment allocation means 202 allocates the pre-determined and pre-stored character 14 or function 15 which corresponds to the output code 12 read by assignment reading means 201. In a preferred embodiment, assignment allocation means 202 is a computer program, cpu, or logic circuit which includes a database holding the pre-stored characters 14 and functions 15 and which is capable of allocating the corresponding character 14 or function 15 to each output code 12 read by assignment reading means 201.

Assignment means 200, and more specifically assignment allocation means 202, is in electrical communication with transmission means 80. Transmission means 80 is activated when assignment allocation means 202 allocates a character 14 or function 15 to output code 12. Once activated, transmission means 80 transmits the character 14 or function 15 which corresponds to the output code 12 generated by output code generation means 70 and which was read by assignment reading means 201. Transmission means 80, in the preferred embodiment, is a logic circuit or any means for electrical communication, such as a cable. Also in the preferred embodiment, transmission means 80 transmits the character 14 so that it appears on a video screen attached to data entry system 10 and transmits the function 15 so that it is performed by data entry system 10.

The activation of release output code generation means 72, assignment means 200, and transmission means 80 by controller 40 comprises a release transmission means 82. As disclosed, release transmission means 82 transmits the character 14 or function 15 corresponding to output code 12 at the moment the depressed key, 20 or 30, generating the code, 22 or 32, is subsequently released, if no other key, 20 or 30, is concurrently depressed by the user. In such case, output code 12 will be assigned a value equivalent to the only code, 22 or 32, stored by either first or second storing means, 64 or 66.

The activation of non-sequential depression output code generation means 74, assignment means 200, and transmission means 80 by controller 40 comprises a non-sequential depression transmission means 84. As disclosed, nonsequential depression transmission means 84 transmits the character 14 or function 15 which corresponds to output code 12 at the moment one of the plurality of primary keys 20 is concurrently depressed with one of at least one secondary key 30. In such a case, output code 12 will be assigned a value equivalent to the sum of the primary code 22 and the secondary code 32 stored by first and second storing means, 64 and 66. Such summation is referred to as the combined code 34.

The activation of primary sequential depression output code generation means 76, assignment means 200, and transmission means 80 by controller 40 comprises a primary sequential depression transmission means 86. As disclosed, primary sequential depression transmission means 86 transmits the character 14 or function 15 corresponding to output code 12 at the moment two primary keys 20 are concurrently depressed. In such a case, output code 12 will be assigned a value equivalent to the primary code 22 which was stored first in time by either first or second storing means, 64 or 66, as detected by timing sequence detection means 69.

The activation of secondary sequential depression output code generation means 78, assignment means 200, and transmission means 80 by controller 40 comprises a secondary sequential depression transmission means 88. As disclosed, secondary sequential depression transmission means 88 transmits the character 14 or function 15 corresponding to output code 12 at the moment two secondary keys 30 are concurrently depressed. In such a case, output code 12 will be assigned a value equivalent to the sum of the two secondary codes 32 stored by first and second storing means, 64 and 66. Such summation is referred to as the combined code 34.

In the preferred embodiment, data entry system 10 comprises nine (9) primary keys 20 and four (4) secondary keys 30. Preferably all of the keys have equal widths except for those keys that utilize lateral movement switches, as described herein.

In an alternative embodiment (not shown in the Figures), data entry system 10 comprises thirteen (13) primary keys 20 and one (1) secondary key 30. In another alternative embodiment (not shown in the Figures), data entry system 10 comprises nine (9) primary keys 20 and two (2) secondary keys 30. In general, any combination of primary keys 20 and secondary keys 30 which can generate at least 26 distinct output codes 12 (corresponding to the 26 letters of the alphabet) is the minimum number of keys, 20 and 30, necessary for alphabetic entry.

Figure 4:
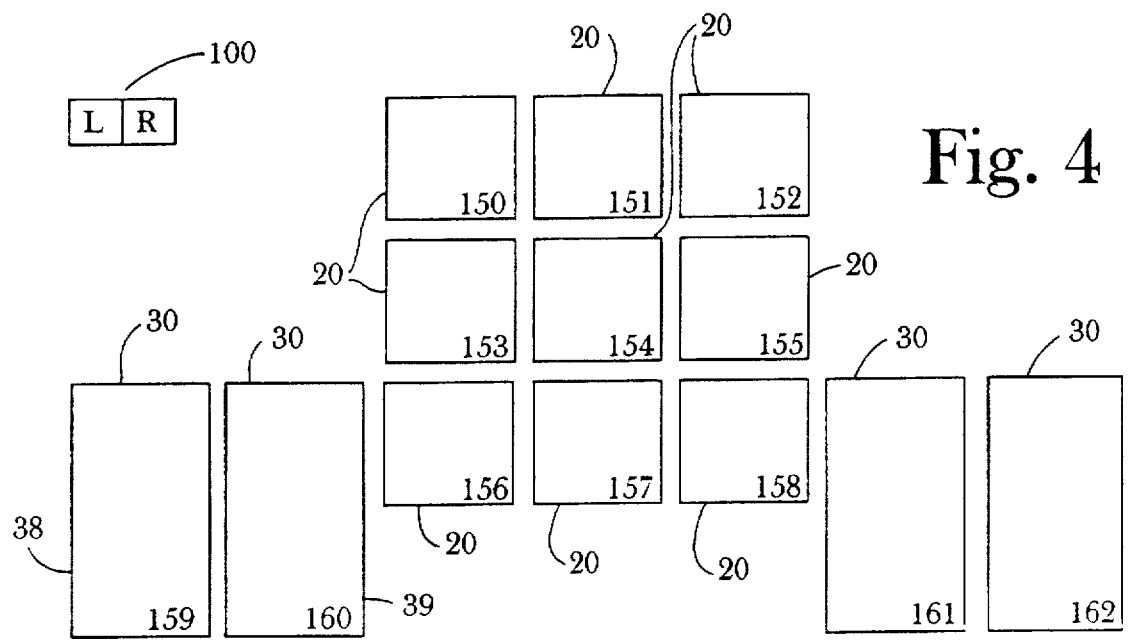
FIG. 4 is a top view of the basic layout of the primary and secondary keys of the data entry system.

The preferred layout of the preferred embodiment of the keys, 20 and 30, is shown in FIG. 4 and is consistent with basic ergonomic principles of the human hand. The nine primary keys 20 are arranged in three aligned rows of three keys each. Each of the primary keys 20 is identical in construction so that the nine primary keys 20 resemble a standard keypad. These primary keys 20 are positioned and constructed for operation by the index finger, the middle finger, and the ring finger of a user. Alternatively, the columns of primary keys 20 may be slightly offset relative to one another to account for and accommodate the differing lengths of adjacent fingers.

The secondary keys 30 are positioned proximal the primary keys 20 so that when the user's hand is properly positioned on the primary keys 20, the user's thumb is naturally proximal to two of the secondary keys 30 and the user's pinky finger is naturally proximal to the remaining two secondary keys 30. Thus, the layout of the secondary keys 30 is symmetrical about the primary keys 20.

In one preferred embodiment, the secondary keys 30 are elongated. The tops of the elongated secondary keys 30 are aligned with the top of the bottom row of primary keys 20. The elongated secondary keys 30 extend below the primary keys 20.

In a preferred embodiment, as shown in FIG. 4, the four secondary keys 30 are arranged in two sets of two keys 30 each. Each set of two secondary keys 30 is arranged in a row positioned at either side of the bottom row of primary keys 20. With this arrangement, the user's thumb and pinky finger must alternate between only two keys to execute the various key combinations.

Figure 5:
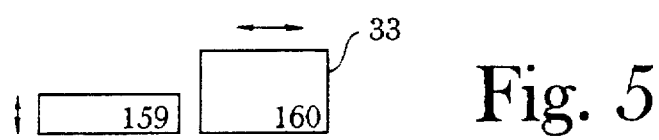
FIG. 5 is a side view of an alternative embodiment of the secondary keys.
Figure 6:
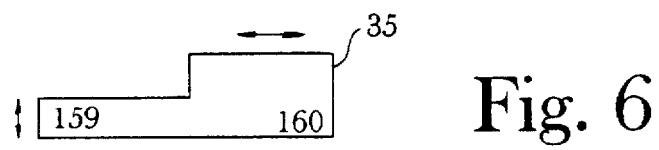
FIG. 6 is a side view of an alternative embodiment of the secondary keys.
Figure 7:
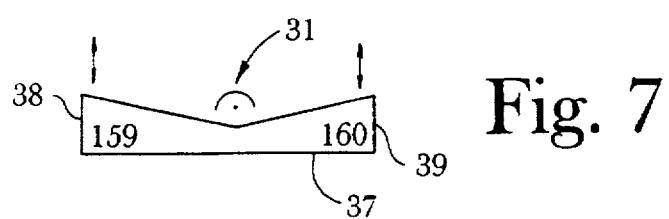
FIG. 7 is a side view of an alternative embodiment of the secondary keys.

In one preferred variation of this design, as shown in FIG. 5, the secondary key 30 nearest the primary keys 20 is a lateral movement switch type key 33. Utilizing such a lateral movement key reduces the amount of movement required by the user in alternating between the secondary keys 30. In an alternate preferred variation of this design, as shown in FIG. 6, the secondary keys 30 are incorporated into a single key 35 wherein one key switch is the downward movement type and the second key switch is the lateral movement type. In yet another alternate preferred variation of this design, as shown in FIG. 7, the secondary keys 30 are incorporated into a single key 37 whose top surface slants downward, from each side, 38 and 39, of the key 37, towards the middle axis 31 of the key 37. The key 37 is capable of rotating about its middle axis 31 so that the depression of each side of the key 37 triggers one of the two key switches.

So that the data entry system 10 may accommodate either right handed or left handed users, the data entry system 10 may also include a selector switch 100, as shown in FIG. 4, for selecting right hand or left hand operation. In such a design, the secondary keys 30 are unchanged and are positioned as described above. Upon activation of selector switch 100, the secondary codes 32 associated with the two secondary keys 30 proximal the user's thumb are assigned to the two secondary keys 30 proximal the user's pinky finger and vice versa. In other words, selector switch 100 switches the secondary codes 32 associated with the two sets of two secondary codes 32 so that the two secondary keys 30 proximal the user's thumb (regardless of whether the user is using his right or left hand) generate the same secondary codes 32 when a left handed user has selector switch 100 in left hand mode and when a right handed user has selector switch 100 in right hand mode.

In operation, the index finger, the middle finger and the ring finger operate the primary keys 20 and the thumb and pinky fingers each operate one set of secondary keys 30. In essence, upon depression of a key, 20 or 30, data entry system 10 generates and transmits a distinct output code 12 which is associated with one character 14 or function 15 so that, upon generation of that distinct output code 12, the character 14 associate with the output code 12 appears on the video screen attached to data entry system 10 or the function 15 associated with the output code 12 is performed.

Data entry system 10 is capable of transmitting and generating an output code 12 under four sets of circumstances, as shown in the logic circuit of FIGS. 8A–8E, based on which keys, 20 and/or 30, are depressed and whether two keys, 20 and/or 30, are depressed concurrently. It must be understood that, since storing means 60 is in electrical communication with output code generation means 70, it is constantly providing output code generation means 70 with the status of its respective functions.

The first set of circumstances corresponds to release transmission means 82 and occurs when key release detection means 68 is activated. In other words, the first set of circumstances occurs when first and second storing means, 64 or 66, store only one code, 22 or 32, between the two of them, and the depressed key, 20 or 30, generating that stored code, 22 or 32, is subsequently released prior to the concurrent depression of any other key, 20 or 30.

Turning to FIG. 8A, upon its depression, a key, 20 or 30, generates its corresponding code, 22 or 32, first storing means 64 stores the code, 22 or 32, generated by the depression of the key, 20 or 30, first code identification means 65 immediately identifies whether the code stored by first storing means 64 is a primary code 22 or a secondary code 32, and timing sequence detection means 69 detects that first storing means 64 is currently storing the code, 22 or 32, stored first in time. If a user subsequently releases the depressed key, 20 or 30 (without concurrently depressing another key, 20 or 30), then key release detection means 68 is activated.

Upon the activation of key release detection means 68, release output code generation means 72 is activated. Now turning to FIG. 8B, upon activation, release output code generation means 72 generates an output code 12 with a value equivalent to the only code, 22 or 32, stored by first and second storing means, 64 and 66. Once output code 12 has been generated, release output code generation means 72 activates cancellation means 110 and assignment means 200.

Upon activation of cancellation means 110, cancellation reading means 111 reads output code 12, and cancellation identification means 112 identifies that release output code generation means 72 was activated. Because release output code generation means 72 was activated, cancellation identification means 112 identifies that the determinative code 36 of output code 12 is the only code, 22 or 32, being stored by first and second storing means, 64 and 66. Once identified, cancellation identification means 112 cancels the code, 22 or 32, (the determinative code 36) from whichever storing means, 64 or 66, is storing the determinative code 36.

Upon activation of assignment means 200, assignment reading means 201 reads output code 12 and assignment allocation means 202 allocates the character 14 or function 15 which corresponds to the generated output code 12. Transmission means 80 (specifically, release transmission means 82) then transmits such character 14 or function 15.

After release transmission means 82 has transmitted character 14 or function 15, first and second storing means, 64 and 66, do not store a code, 22 or 32, and the data entry system 10 reverts back to its initial state.

The second set of circumstances corresponds to non-sequential depression transmission means 84 and occurs when a user concurrently depresses one primary key 20 and one secondary key 30. In this set of circumstances, a user may depress the secondary key 30 first and the primary key 20 second, or vice versa, and the same output code 12 will be generated by data entry system 10.

Turning to FIG. 8A, if the secondary key 30 is depressed first, upon its depression, the secondary key 30 generates its corresponding secondary code 32, first storing means 64 stores the secondary code 32 generated by the depression of the secondary key 30, first code identification means 65 immediately identifies that the code stored by first storing means 64 is a secondary code 32 and not a primary code 22, and timing sequence detection means 69 detects that first storing means 64 is currently storing the code, 22 or 32, stored first in time. If a user, while keeping secondary key 30 depressed, also depresses a primary key 20, upon its depression, the primary key 20 generates its corresponding primary code 22, second storing means 66 stores the primary code 22 generated by the depression of the primary key 20, and second code identification means 67 immediately identifies that the code stored by second storing means 66 is a primary code 22 and not a secondary code 32. It should be noted that, in this case, key release detection means 68 is not activated because two keys, 20 and 30, are being concurrently depressed.

If the primary key 20 is depressed first, upon its depression, the primary key 20 generates its corresponding primary code 22, first storing means 64 stores the primary code 22 generated by the depression of the primary key 20, first code identification means 65 immediately identifies that the code stored by first storing means 64 is a primary code 22 and not a secondary code 32, and timing sequence detection means 69 detects that first storing means 64 is currently storing the code, 22 or 32, stored first in time. If a user, while keeping primary key 20 depressed, also depresses a secondary key 30, upon its depression, the secondary key 30 generates its corresponding secondary code 32, second storing means 66 stores the secondary code 32 generated by the depression of the secondary key 30, and second code identification means 67 immediately identifies that the code stored by second storing means 66 is a secondary code 32 and not a primary code 22. It should be noted that, in this case, key release detection means 68 is not activated because two keys, 20 and 30, are being concurrently depressed.

Non-sequential depression output code generation means 74 is activated when output code generation means 70 receives the information that key release detection means 68 has not been activated and that first and second code identification means, 65 and 67, identify that first and second storing means, 64 and 66, have stored a primary code 22 and a secondary code 32, regardless of which storing means, 64 and 66, has stored which code, 22 and 32.

Figure 8B:
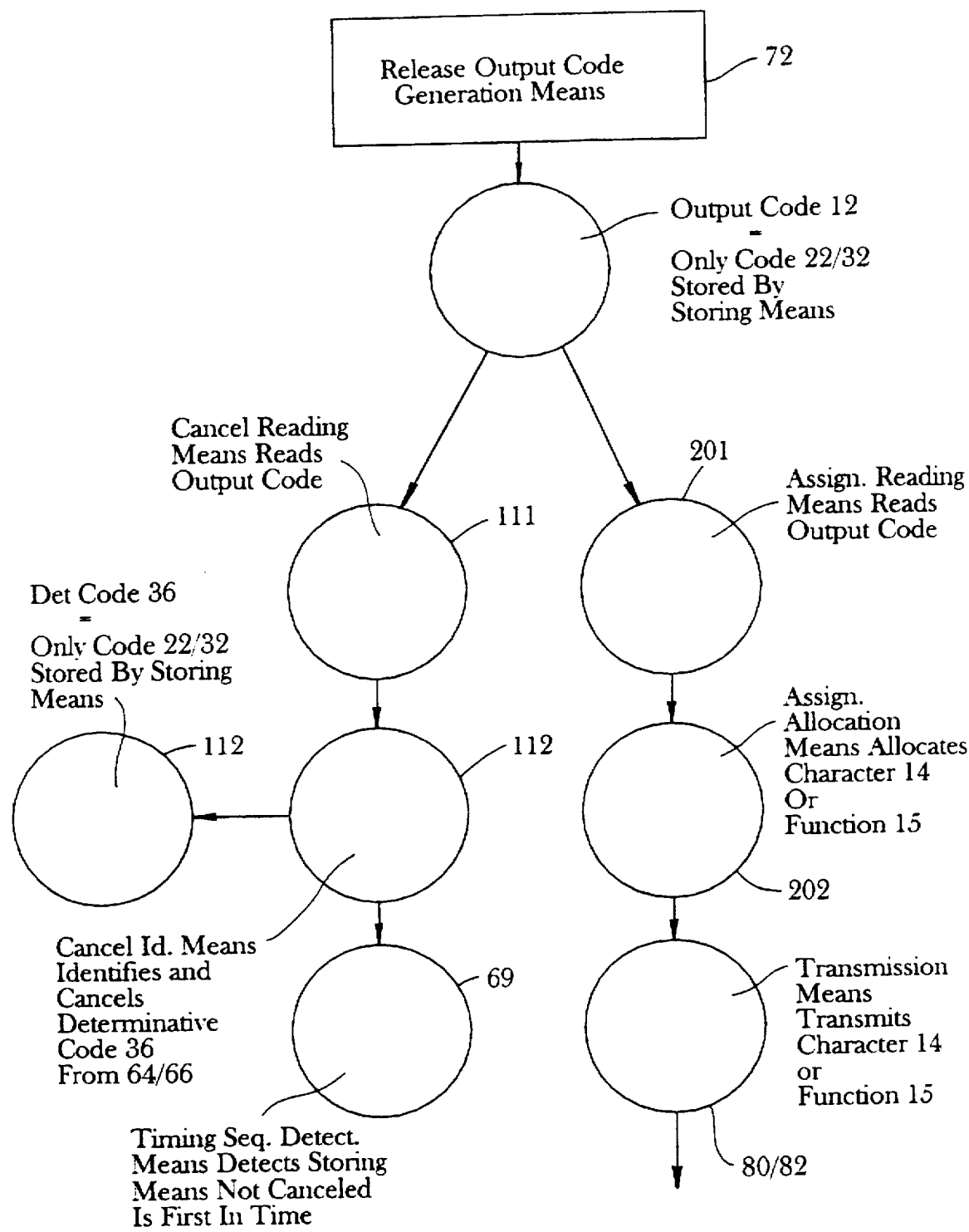
FIG. 8B is a detailed logic circuit diagram of the data entry system after and including the release output code generation means.
Figure 8C:
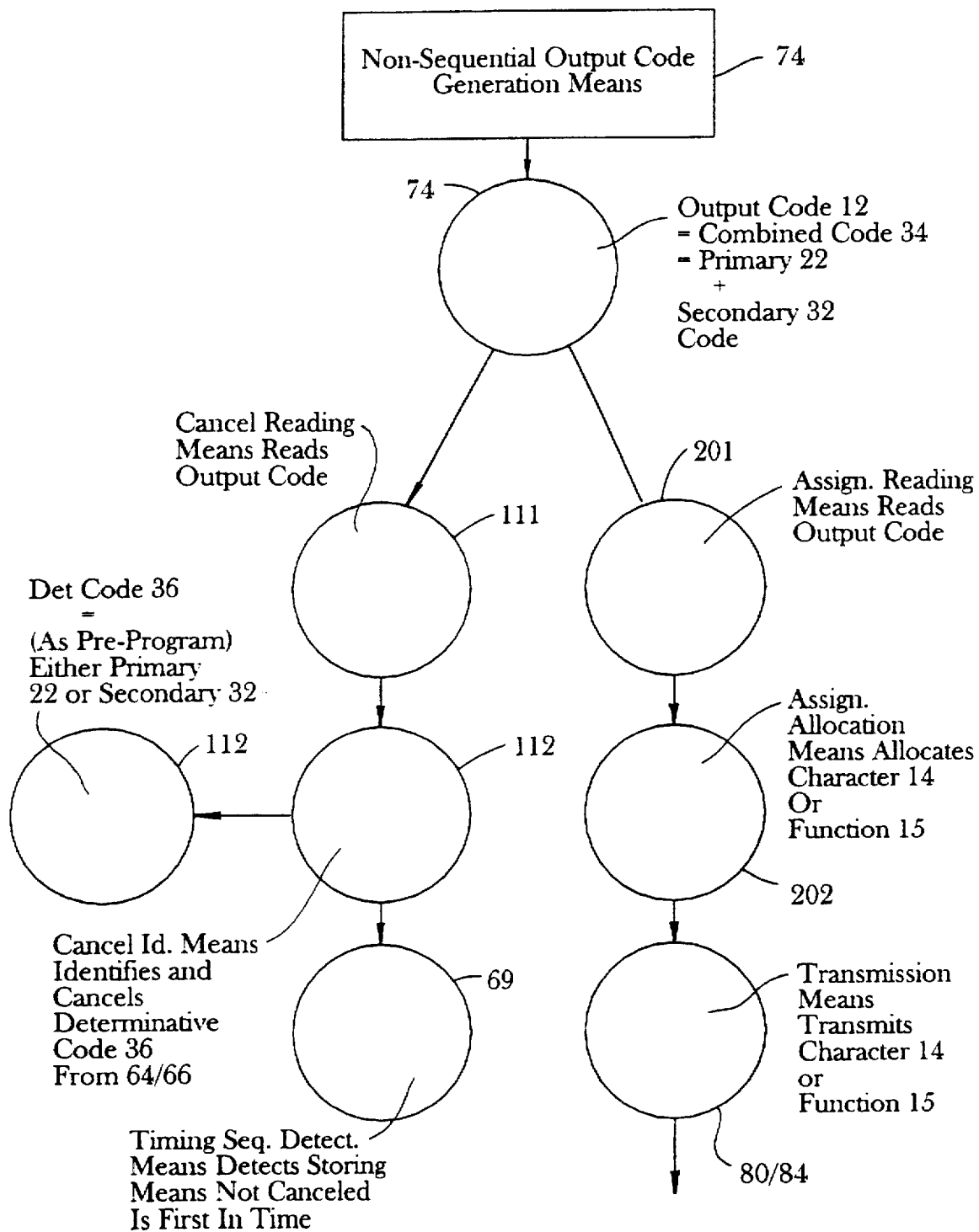
FIG. 8C is a detailed logic circuit diagram of the data entry system after and including the non-sequential depression output code generation means.
Figure 8D:
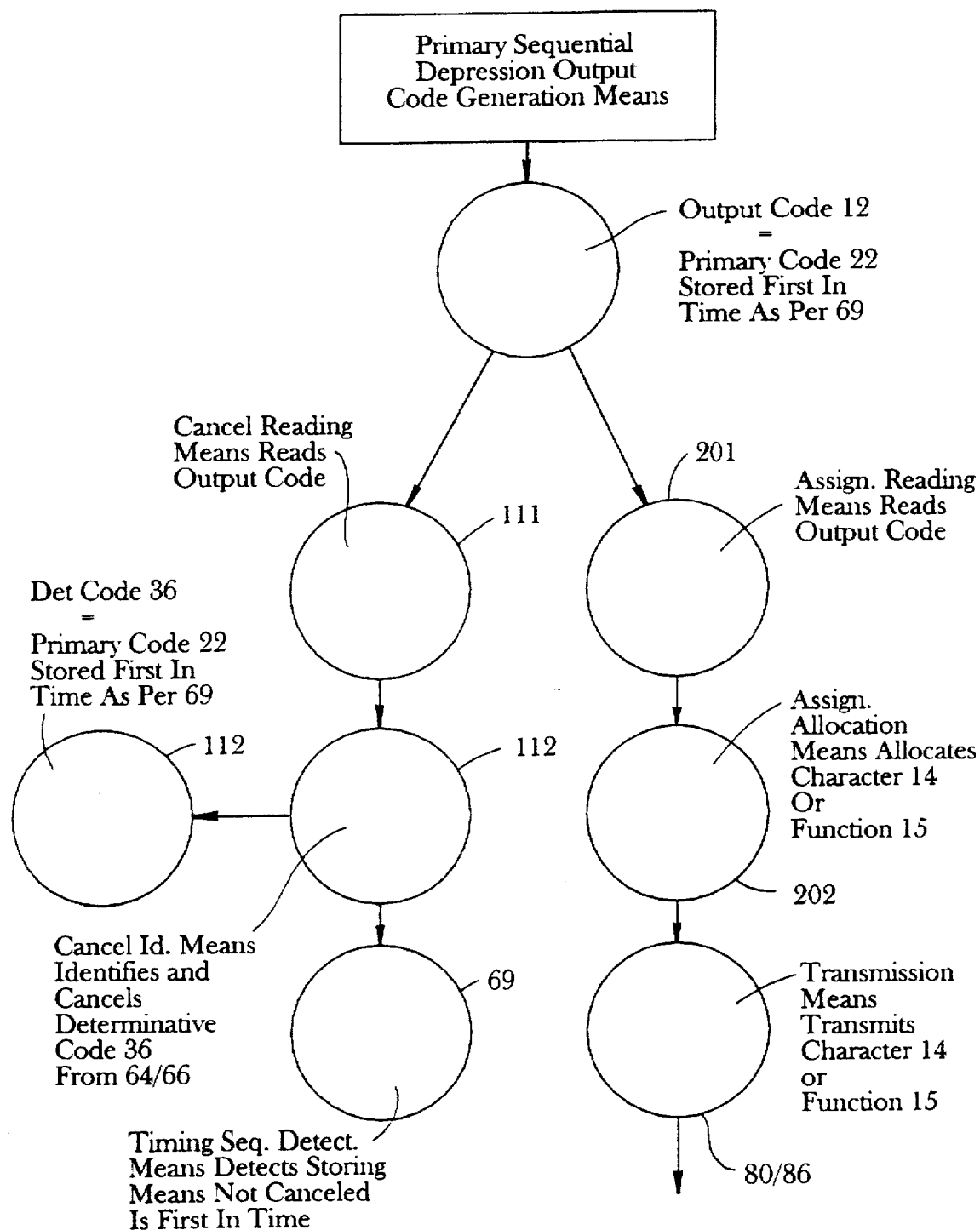
FIG. 8D is a detailed logic circuit diagram of the data entry system after and including the primary sequential depression output code generation means.
Figure 8E:
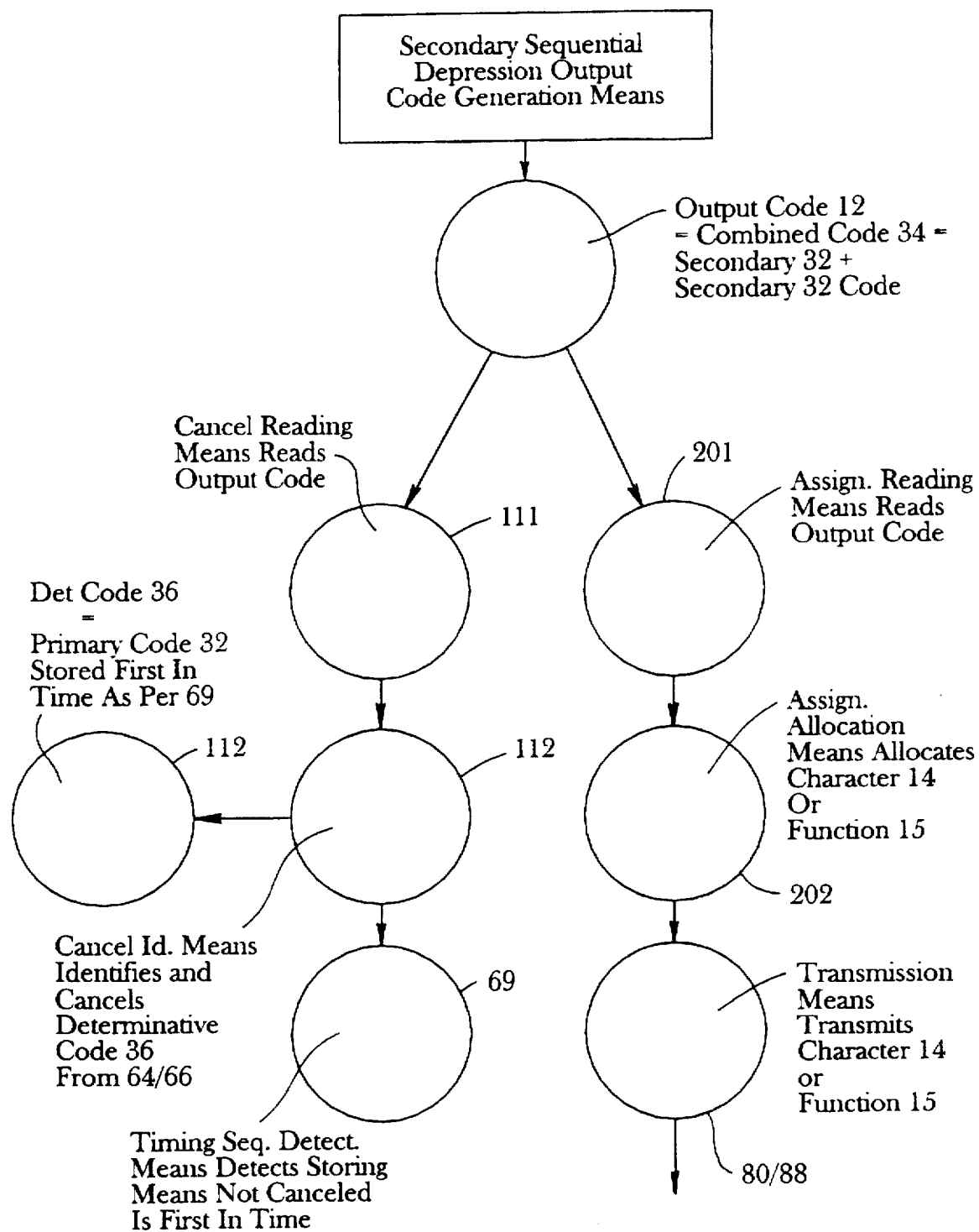
FIG. 8E is a detailed logic circuit diagram of the data entry system after and including the secondary sequential depression output code generation means.

Now turning to FIG. 8C, upon activation, non-sequential depression output code generation means 74 generates an output code 12 with a value equivalent to a combined code 34, the sum of the primary code 22 and the secondary code 32 stored by first and second storing means, 64 and 66. Once output code 12 has been generated, non-sequential depression output code generation means 74 activates cancellation means 110 and assignment means 200.

Upon activation of cancellation means 110, cancellation reading means 111 reads output code 12, and cancellation identification means 112 identifies that non-sequential output code generation means 74 was activated. Because non-sequential output code generation means 74 was activated, cancellation identification means 112 identifies that the determinative code 36 of output code 12 is either the primary code 22 or the secondary code 32 stored by first and second storing means, 64 and 66, and identified by first and second code identification means, 65 and 67. It is understood that the determinative code 36 is pre-selected and pre-programmed to be either the primary code 22 or the secondary code 32, depending on the needs of the user. Once identified, cancellation identification means 112 cancels the code, 22 or 32, (the determinative code 36) from whichever storing means, 64 or 66, is storing the determinative code 36.

If the code, 22 or 32, (determinative code 36) is canceled from first storing means 64, then second storing means 66 is the only storing means, 64 and 66, which currently stores a code, 22 or 32. Accordingly, timing sequence detection means 69 now detects second storing means 66 as the storing means, 64 and 66, which is currently storing the code, 22 or 32, stored first in time in relation to any other subsequent and concurrent code generation. If the code, 22 or 32, (determinative code 36) is canceled from second code reception means 66, then first storing means 64 is the only storing means, 64 and 66, which currently stores a code, 22 or 32. Timing sequence detection means 69 then detects first storing means 64 as the storing means, 64 and 66, which is currently storing the code, 22 or 32, stored first in time in relation to any other subsequent and concurrent code generation.

Upon activation of assignment means 200, assignment reading means 201 reads output code 12 and assignment allocation means 202 allocates the character 14 or function 15 which corresponds to the output code 12 generated by non-sequential depression output code generation means 74. Transmission means 80 (specifically, non-sequential depression transmission means 84) then transmits the character 14 or function 15 which corresponds to the output codes 12.

After non-sequential depression transmission means 84 has transmitted character 14 or function 15, first and second storing means, 64 and 66, still store one secondary code 32. It should be understood that, at this point, controller 40 is prepared to once again activate release transmission means 82, non-sequential depression transmission means 84, primary sequential depression transmission means 86, or secondary sequential depression transmission means 88.

If the key, 20 or 30, which is generating the one code, 22 or 32, still being stored by first and second storing means, 64 and 66, is released before the concurrent depression of another key, 20 or 30, then release output code generation means 72 and release transmission means 82 may be activated. In order to avoid unintentional entries, the controller 40, however, may be pre-programmed so that the subsequent release of the secondary key 30 does not generate another output code 12 in this situation.

If subsequent to the cancellation of the determinative code 36 but prior to the release of the depressed key, 20 or 30, another code, 22 or 32, is generated by the depression of another key, 20 or 30, then the storing means, 64 or 66, which is currently empty (not storing a code) stores the other code, 22 or 32. Once two codes, 22 or 32, are again concurrently stored by first and second storing means, 64 and 66, then either non-sequential depression transmission means 84, primary sequential depression transmission means 86, or secondary sequential depression transmission means 88 is activated, depending on whether the stored codes, 22 or 32, are primary or secondary codes, 22 or 32.

At the point when first and second storing means, 64 and 66, do not store a code, 22 or 32, the data entry system 10 reverts back to its initial state.

The third set of circumstances corresponds to primary sequential depression transmission means 86 and occurs when a user concurrently depresses two primary keys 20.

Turning to FIG. 8A, upon depression of the first primary key 20, the primary key 20 generates its corresponding primary code 22, first storing means 64 stores the primary code 22, generated by the depression of the first primary key 20, first code identification means 65 immediately identifies that the code stored by first storing means 64 is a primary code 22 and not a secondary code 32, and timing sequence detection means 69 detects that first storing means 64 is currently storing the primary code 22 stored first in time. If a user, while keeping the first primary key 20 depressed, also depresses a second primary key 20, upon its depression, the second primary key 20 generates its corresponding primary code 22, second storing means 66 stores the primary code 22 generated by the depression of the second primary key 20, and second code identification means 67 immediately identifies that the code stored by second storing means 66 is a primary code 22 and not a secondary code 32. It should be noted that, in this case, key release detection means 68 is not activated because two primary keys 20 are being concurrently depressed.

Primary sequential depression output code generation means 76 is activated when output code generation means 70 receives the information that key release detection means 68 has not been activated and that first and second code identification means, 65 and 67, identify that first and second storing means, 64 and 66, have each stored a primary code 22. Now turning to FIG. 8D, upon activation, primary sequential depression output code generation means 76 generates an output code 12 with a value equivalent to the primary code 22 stored first in time by first or second storing means, 64 or 66, as presently detected by timing sequence detection means 69. Once output code 12 has been generated, primary sequential depression output code generation means 76 activates cancellation means 110 and assignment means 200.

Upon activation of cancellation means 110, cancellation reading means 111 reads the output code 12, and cancellation identification means 112 identifies that primary sequential depression output code generation means 76 was activated. Because primary sequential depression output code generation means 76 was activated, cancellation identification means 112 identifies that the determinative code 36 of output code 12 is the primary code 22 stored first in time by either first or second storing means, 64 and 66, as detected by timing sequence detection means 69. Once identified, cancellation identification means 112 cancels the determinative code 36 from whichever storing means, 64 or 66, is storing the determinative code 36.

If the primary code 22 is canceled from first storing means 64, then second storing means 66 is the only storing means, 64 and 66, which currently stores a code, 22 or 32. Accordingly, timing sequence detection means 69 now detects second storing means 66 as the storing means, 64 and 66, which is currently storing the code, 22 or 32, stored first in time in relation to any other subsequent and concurrent code generation. If the primary code 22 is canceled from second storing means 66, then first storing means 64 is the only storing means, 64 and 66, which currently stores a code, 22 or 32. Timing sequence detection means 69 then detects first storing means 64 as the storing means, 64 and 66, which is currently storing the code, 22 or 32, stored first in time in relation to any other subsequent and concurrent code generation.

Upon activation of assignment means 200, assignment reading means 201 reads output code 12 and assignment allocation means 202 allocates the character 14 or function 15 which corresponds to the output code 12 generated by primary sequential depression output code generation means 76. Transmission means 80 (specifically, primary sequential depression transmission means 86) then transmits the character 14 or function 15 which corresponds to the output codes 12.

After primary sequential depression transmission means 86 has transmitted character 14 or function 15, first and second storing means, 64 and 66, still store one primary code 22. It should be understood that, at this point, controller 40 is prepared to once again initiate release transmission means 82, non-sequential depression transmission means 84, or primary sequential depression transmission means 86.

If the primary key 20 which is generating the one primary code 22 still being stored by first and second storing means, 64 and 66, is released before the concurrent depression of another key, 20 or 30, then release output code generation means 72 and release transmission means 82 are activated.

If subsequent to the cancellation of the primary code 22 stored first in time but prior to the release of the still active depressed primary key 20, another code, 22 or 32, is generated by the depression of another key, 20 or 30, then the storing means, 64 or 66, which is currently empty (not storing a code) stores the other code, 22 or 32. Once two codes, 22 or 32, are again concurrently stored by first and second storing means, 64 and 66, then either non-sequential depression transmission means 84, or primary sequential depression transmission means 86 is activated, depending on whether the other code, 22 or 32, is a primary or secondary code.

At the point when first and second storing means, 64 and 66, do not store a code, 22 or 32, the data entry system 10 reverts back to its initial state.

The fourth set of circumstances corresponds to secondary sequential depression transmission means 88 and occurs when a user concurrently depresses two secondary keys 30.

Turning to FIG. 8A, upon depression of the first secondary key 30, the secondary key 30 generates its corresponding secondary code 32, first storing means 64 stores the secondary code 32, generated by the depression of the first secondary key 30, first code identification means 65 immediately identifies that the code stored by first storing means 64 is a secondary code 32 and not a primary code 22, and timing sequence detection means 69 detects that first storing means 64 is currently storing the secondary code 32 stored first in time. If a user, while keeping the first secondary key 30 depressed, also depresses a second secondary key 30, upon its depression, the second secondary key 30 generates its corresponding secondary code 32, second storing means 66 stores the secondary code 32 generated by the depression of the second secondary key 30, and second code identification means 67 immediately identifies that the code stored by second storing means 66 is a secondary code 32 and not a primary code 22. It should be noted that, in this case, key release detection means 68 is not activated because two secondary keys 30 are being concurrently depressed.

Secondary sequential depression output code generation means 78 is activated when output code generation means 70 receives the information that key release detection means 68 has not been activated and that first and second code identification means, 65 and 67, identify that first and second storing means, 64 and 66, have each stored a secondary code 32. Now turning to FIG. 8E, upon activation, secondary sequential depression output code generation means 78 generates an output code 12 with a value equivalent to a combined code 34, the sum of the two secondary codes 32 stored by first and second storing means, 64 and 66. Once output code 12 has been generated, secondary sequential depression output code generation means 78 activates cancellation means 110 and assignment means 200.

Upon activation of cancellation means 110, cancellation reading means 111 reads the output code 12, and cancellation identification means 112 identifies that secondary sequential depression output code generation means 78 was activated. Because secondary sequential depression output code generation means 78 was activated, cancellation identification means 112 identifies that the determinative code 36 of output code 12 is the secondary code 32 stored first in time by first and second storing means, 64 and 66, as detected by timing sequence detection means 69. Once identified, cancellation identification means 112 cancels the determinative code 36 from first and second storing means, 64 or 66.

Upon activation of assignment means 200, assignment reading means 201 reads output code 12 and assignment allocation means 202 allocates the character 14 or function 15 which corresponds to the output code 12 generated by primary sequential depression output code generation means 76. Transmission means 80 (specifically, secondary sequential depression transmission means 88) then transmits the character 14 or function 15 which corresponds to the output codes 12.

After secondary sequential depression transmission means 88 has transmitted character 14 or function 15, first and second storing means, 64 and 66, still store one secondary code 32. It should be understood that, at this point, controller 40 is prepared to once again initiate release transmission means 82, non-sequential depression transmission means 84, or secondary sequential depression transmission means 88.

If the secondary key 30 which is generating the one secondary code 32 still being stored by first and second storing means, 64 and 66, is released before the concurrent depression of another key, 20 or 30, then release output code generation means 72 and release transmission means 82 are activated. In order to avoid unintentional entries, the controller 40, however, may be pre-programmed so that the subsequent release of the secondary key 30 does not generate another output code 12 in this situation.

If subsequent to the cancellation of the secondary code 32 stored first in time but prior to the release of the still active depressed secondary key 30, another code, 22 or 32, is generated by the depression of another key, 20 or 30, then the storing means, 64 or 66, which is currently empty (not storing a code) stores the other code, 22 or 32. Once two codes, 22 or 32, are again concurrently stored by first and second storing means, 64 and 66, then either non-sequential depression transmission means 84, or secondary sequential depression transmission means 88 is activated, depending on whether the other code, 22 or 32, is a primary or secondary code.

At the point when first and second storing means, 64 and 66, do not store a code, 22 or 32, the data entry system 10 reverts back to its initial state.

As previously disclosed, a preferred embodiment comprises nine (9) primary keys 20 and four (4) secondary keys 30. In the preferred embodiment, the nine (9) primary keys 20 are arranged in three aligned rows of three keys each, and the four secondary keys 30 are divided into sets of two secondary keys 30 with a set located next to each side of the bottom row of primary keys 20.

For purposes of brevity and as shown in FIG. 4, each of the nine primary keys 20 is assigned the following reference number:

primary key 20 at row 1, column 1-150;
primary key 20 at row 1, column 2-151;
primary key 20 at row 1, column 3-152;
primary key 20 at row 2, column 1-153;
primary key 20 at row 2, column 2-154;
primary key 20 at row 2, column 3-155;
primary key 20 at row 3, column 1-156;
primary key 20 at row 3, column 2-157; and,
primary key 20 at row 3, column 3-158.

The nine primary keys 20 will hereinafter be referenced using their assigned reference numbers.

Also for purposes of brevity, each of the four secondary keys 30 is assigned the following reference number:

secondary key 30 proximal primary key 156-160;

secondary key 30 proximal secondary key 160-159;

secondary key 30 proximal primary key 158-161; and secondary key 30 proximal secondary key 161-162.

The four secondary keys 30 will hereinafter be referenced using their assigned reference numbers.

As also previously disclosed, the depression of a key, 20 or 30, generates a code, 22 or 32. The primary code 22, secondary code 32, or combined code 34 (summation of a primary code 22 and a secondary code 32 or summation of two secondary codes 32) generated dictate the output code 12 generated by output code generation means 70 and thus also dictate the character 14 or function 15 transmitted by transmission means 80. Assignment means 200, as previously disclosed, provides the character 14 or function 15 which corresponds to the particular output code 12 generated by output code generation means 70.

In the preferred embodiment and as shown in FIG. 9, assignment means 200 is pre-programmed so that the depression/release of only the primary keys 20 (without concurrent depression of a secondary key 30) generates output codes 12 which are associated with the following specific characters 14:

primary key 150-"a";

primary key 151-"r";

primary key 152-"w";

primary key 153-"e";

primary key 154-"h";

primary key 155-"t";

primary key 156-"o";

primary key 157-"1"; and, primary key 158-"y".

In the preferred embodiment and as shown in FIG. 9, when selector switch 100 is on the right hand operation, assignment means 200 is pre-programmed so that the concurrent depression of each primary key 20 with the secondary key 160 generates output codes 12 which are associated with the following specific characters 14:

primary key 150+secondary key 160-"x";

primary key 151+secondary key 160-"b";

primary key 152+secondary key 160-"j";

primary key 153+secondary key 160-"k";

primary key 154+secondary key 160-"f";

primary key 155+secondary key 160-"c";

primary key 156+secondary key 160-"";

primary key 157+secondary key 160-"v"; and, primary key 158+secondary key 160-"z".

It is understood that, if the selector switch 100 is in the left-hand operation, the concurrent depression of the primary keys 20 as described above with secondary key 161 will generate the identical output codes 12 and characters 14.

In the preferred embodiment and as shown in FIG. 9, when selector switch 100 is on the right hand operation, assignment means 200 is pre-programmed so that the concurrent depression of each primary key 20 with the secondary key 159 generates output codes 12 which are associated with the following specific characters 14 or functions 15:

primary key 150+secondary key 159-"q";

primary key 151+secondary key 159-"m";

primary key 152+secondary key 159-"p";

primary key 153+secondary key 159-"u";

primary key 154+secondary key 159-"s";

primary key 155+secondary key 159-"d";

primary key 156+secondary key 159-"i";

primary key 157+secondary key 159-"n"; and, primary key 158+secondary key 159-"g".

It is understood that, if the selector switch 100 is in the left-hand operation, the concurrent depression of the primary keys 20 as described above with secondary key 162 will generate the identical output codes 12 and characters 14.

Data entry system 10 is also capable of generating output codes 12 and corresponding functions 15 which assign each primary key 20 a distinct primary code 22 and each secondary code 32 a distinct secondary code 32. Such an output code 12 essentially provides data entry system 10 with additional modes in which each key, 20 and 30, generates different primary and secondary codes, 22 and 32, and data entry system 10 generates different output codes 12. Thus, such modes provide data entry system 10 the capability to generate a greater number of output codes 12 for a given number of keys, 20 and 30. In the preferred embodiment, data entry system 10 includes three such modes: shift mode 91, symbol mode 92, and number mode 93.

If the selector switch 100 is in right hand operation, shift mode 91 is activated [1] if secondary key 162 is depressed and concurrently thereafter another secondary key 30 is also depressed or [2] if secondary key 162 is depressed concurrently with a primary key 20, regardless of which key, 20 or 162, is depressed first. Either action results in the generation of an output code 12 and corresponding function 15 which provides each primary and secondary key, 20 and 30, distinct and different primary and secondary codes, 22 and 32, respectively. In this situation, the output code 12 generated is the combined code 34 associated with the summation of secondary key 162 and the other key, 20 or 30. The function 15 associated with the combined code 34 changes the codes, 22 and 32, of each key, 20 and 30, including those keys, 20 and 30, which are already depressed.

Furthermore, regardless of whether shift mode 91 is activated by the sequential and concurrent depression of secondary key 162 and another secondary key 20 or by the concurrent depression of secondary key 162 and a primary key 20, in either case, the determinative code 36 is the secondary code 32 generated by the depressed secondary key 162. Thus, the secondary code 32 generated by the depressed secondary key 162 is the determinative code 36 which will be canceled from first or second storing means, 64 or 66, by cancellation identification means 112.

If shift mode 91 is activated by the sequential and concurrent depression of secondary key 162 and another secondary code 30, then secondary sequential depression output code generation means 78 is activated and the secondary code 32 stored first in time, in this case the code generated by secondary key 162, is the determinative code 36. Once the determinative code 36 is identified and canceled, first and second storing means, 64 and 66, still store one secondary code 32 corresponding to the other secondary key 30, which was concurrently depressed with secondary key 162.

If shift mode 91 is activated by the concurrent depression of secondary key 162 and a primary key 20, then non-sequential depression output code generation means 76 is activated. If non-sequential depression output code generation means 76 is activated, then either the secondary code 32 or the primary code 22 stored by storing means, 64 and 66, could be the determinative code 36, depending on the program of cancellation identification means 112. For shift mode 91 to be functional, cancellation identification means 112 must be pre-programmed so that it identifies the secondary code 32 generated by the depression of secondary key 162 as the determinative code 36 when it is concurrently depressed with a primary key 20. Once the determinative code 36 is identified and canceled, first and second storing means, 64 and 66, still store one primary code 22 corresponding to the primary key 20 which was concurrently depressed with secondary key 162.

Shift mode 91 remains activated only during the depression of secondary key 162. Therefore, in order to generate any character 14 or function 15 associated with shift mode 91, a user must maintain the secondary key 162 depressed. It is understood that, if the selector switch 100 is in the left-hand operation, shift mode 91 is activated as outlined herein but with the depression of secondary key 159 instead.

In the preferred embodiment and as shown in FIG. 10, when shift mode 91 is activated, assignment means 200 is pre-programmed so that the same key combinations which generate the lower case letter characters 14 as detailed herein produce output codes 12 which are associated with the upper case of each letter character 14.

It is also understood that if the selector switch 100 is in the right hand operation and if secondary key 162 is depressed and then released before any other key, 20 or 30, is concurrently depressed, then release output code generation means 68 is activated generating an output code 12 which is associated by assignment means 200 with the "(SPACE)" character 14. And, if the selector switch 100 is in the left-hand operation and secondary key 159 is depressed and released before any other key, 20 or 30, is concurrently depressed, then release output code generation means 68 is activated generating an output code 12 which is associated by assignment means 200 with the "(SPACE)" character 14.

If the selector switch 100 is in the right hand operation, symbol mode 92 is activated [1] if secondary key 161 is depressed and concurrently thereafter another secondary key 30 is also depressed or [2] if secondary key 161 is depressed concurrently with a primary key 20, regardless of which key, 20 or 161, is depressed first. Either action results in the generation of an output code 12 and corresponding function 15 which provides each primary and secondary key, 20 and 30, distinct and different primary and secondary codes, 22 and 32, respectively. In this situation, the output code 12 generated is the combined code 34 associated with the summation of secondary key 161 and the other key, 20 or 30. The function 15 associated with the combined code 34 changes the codes, 22 and 32, of each key, 20 and 30, including those keys, 20 and 30, which are already depressed.

Furthermore, regardless of whether symbol mode 92 is activated by the sequential and concurrent depression of secondary key 161 and another secondary key 20 or by the concurrent depression of secondary key 161 and a primary key 20, in either case, the determinative code 36 is the secondary code 32 generated by the depressed secondary key 161. Thus, the secondary code 32 generated by the depressed secondary key 161 is the determinative code 36 which will be canceled from first or second storing means, 64 or 66, by cancellation identification means 112.

If symbol mode 92 is activated by the sequential and concurrent depression of secondary key 161 and another secondary code 30, then secondary sequential depression output code generation means 78 is activated and the secondary code 32 stored first in time, in this case the code generated by secondary key 161, is the determinative code 36. Once the determinative code 36 is identified and canceled, first and second storing means, 64 and 66, still store one secondary code 32 corresponding to the secondary key 30 which was concurrently depressed with secondary key 161.

If symbol mode 92 is activated by the concurrent depression of secondary key 161 and a primary key 20, then non-sequential depression output code generation means 76 is activated. If non-sequential depression output code generation means 76 is activated, then either the secondary code 32 or the primary code 22 stored by storing means, 64 and 66, could be the determinative code 36, depending on the program of cancellation identification means 112. For symbol mode 92 to be functional, cancellation identification means 112 must be pre-programmed so that it identifies the secondary code 32 generated by the depression of secondary key 161 as the determinative code 36 when it is concurrently depressed with a primary key 20. Once the determinative code 36 is identified and canceled, first and second storing means, 64 and 66, still store one primary code 22 corresponding to the primary key 20 which was concurrently depressed with secondary key 161.

Symbol mode 92 remains activated only during the depression of secondary key 161. Therefore, in order to generate any character associated with symbol mode 92, a used must maintain the secondary key 161 depressed. It is understood that, if the selector switch 100 is in the left-hand operation, shift mode 91 is activated as outlined herein but with the depression of secondary key 160 instead.

In the preferred embodiment and as shown in FIG. 11, when the symbol mode 92 is activated, assignment means 200 is pre-programmed so that the depression of only the primary keys 20 (without concurrent depression of a secondary key 30) generates output codes 12 which are associated with the following specific characters 14:

primary key 150-"@";
primary key 151-"+";
primary key 152-"~";
primary key 153-"&";
primary key 154-"$_{13}$";
primary key 155-"!";
primary key 156-"(";
primary key 157-"""; and,
primary key 158-")".

In the preferred embodiment and as shown in FIG. 11, when the symbol mode 92 is activated and when selector switch 100 is on the right hand operation, assignment means 200 is pre-programmed so that the concurrent depression of each primary key 20 with the secondary key 160 generates output codes 12 which are associated with the following specific characters 14:

primary key 150+secondary key 160-"\";
primary key 151+secondary key 160-"'";
primary key 152+secondary key 160-"|";
primary key 153+secondary key 160-";";
primary key 154+secondary key 160-"^";
primary key 155+secondary key 160-":";
primary key 156+secondary key 160-")";
primary key 157+secondary key 160-">"; and,
primary key 158+secondary key 160-"]".

It is understood that, if the selector switch 100 is in the left-hand operation, the concurrent depression of the primary keys 20 as described above with secondary key 161 will generate the identical output codes 12 and characters 14.

In the preferred embodiment and as shown in FIG. 11, when the symbol mode 92 is activated and when selector switch 100 is on the right hand operation, assignment means 200 is pre-programmed so that the concurrent depression of each primary key 20 with the secondary key 159 generates output codes 12 which are associated with the following specific characters 14:

primary key 150+secondary key 159-"?";
primary key 151+secondary key 159-"=";
primary key 152+secondary key 159-"#";
primary key 153+secondary key 159-"/";
primary key 154+secondary key 159-"*";
primary key 155+secondary key 159-"-";
primary key 156+secondary key 159-"{";
primary key 157+secondary key 159-"<"; and,
primary key 158+secondary key 159-"[";

It is understood that, if the selector switch 100 is in the left-hand operation, the concurrent depression of the primary keys 20 as described above with secondary key 162 will generate the identical output codes 12 and characters 14.

It is also understood that if the selector switch 100 is in the right hand operation and if secondary key 161 is depressed and then released before any other key, 20 or 30, is concurrently depressed, then release output code generation means 68 is activated generating an output code 12 which is associated by assignment means 200 with the "ENTER" function 15. And, if the selector switch 100 is in the left-hand operation and secondary key 160 is depressed and released before any other key, 20 or 30, is concurrently depressed, then release output code generation means 68 is activated generating an output code 12 which is associated by assignment means 200 with the "ENTER" function 15.

If the selector switch 100 is in the right-hand operation, number mode 93 is activated if, by itself, secondary key 160 is depressed and released twice within a pre-determined amount of time. Such action results in the generation of an output code 12 and corresponding function 15 which provides each primary and secondary key, 20 and 30, distinct and different primary and secondary codes, 22 and 32, respectively. Number mode 93 remains activated until secondary key 160 is once again depressed and released by itself. Therefore, in essence, secondary key 160 (and its solitary depression and release) acts as an on/off toggle key. It is understood that, if the selector switch 100 is in the left hand operation, number mode 93 is activated by the depression and release of secondary key 161.

In the preferred embodiment and as shown in FIG. 12A, when number mode 93 is activated, assignment means 200 is pre-programmed so that the depression of only the primary keys 20 (without concurrent depression of a secondary key 30) generates output codes 12 which are associated with the following specific characters 14:

primary key 150-"7";
primary key 151-"8";
primary key 152-"9";
primary key 153-"4";
primary key 154-"5";
primary key 155-"6";
primary key 156-"1";
primary key 157-"2"; and,
primary key 158-"3".

In the preferred embodiment and as shown in FIG. 12B, when number mode 93 is activated and when selector switch is on the right hand operation, assignment means 200 is pre-programmed so that the concurrent depression of each primary key 20 with the secondary key 162 generates output codes 12 which are associated with the following specific functions 15 (function are underlined) which are commonly known in prior art keyboards as "the 12 function keys":

primary key 150+secondary key 162-"FUNCTION 1";
primary key 151+secondary key 162-"FUNCTION 2";
primary key 152+secondary key 162-"FUNCTION 3";
primary key 153+secondary key 162-"FUNCTION 4";
primary key 154+secondary key 162-"FUNCTION 5";
primary key 155+secondary key 162-"FUNCTION 6";
primary key 156+secondary key 162-"FUNCTION 7";
primary key 157+secondary key 162-"FUNCTION 8"; and,
primary key 158+secondary key 162-"FUNCTION 9".

It is understood that, if the selector switch 100 is in the left-hand operation, the concurrent depression of the primary keys 20 as described above with secondary key 159 will generate the identical output codes 12 and characters 14 or functions 15.

In the preferred embodiment and as shown in FIG. 12B, when number mode 93 is activated and when selector switch is on the right hand operation, assignment means 200 is pre-programmed so that the sequential concurrent depression of the following primary and secondary keys, 20 and 30, generate output codes 12 which are associated with the following specific functions 15 (function are underlined) which are commonly associated in prior art keyboards as "the 12 function keys":

secondary key 162+secondary key 159+primary key 156-"FUNCTION 10";
secondary key 162+secondary key 160+primary key 156-"FUNCTION 11"; and
secondary key 162+secondary key 159+primary key 157-"FUNCTION 12".

In this case, the output code 12 generated by the concurrent depression of secondary key 162 and any other key, 20 and 30, changes all the primary and secondary codes, 22 and 32, associated with all of the primary and secondary keys, 20 and 30. Thus, in this case, secondary key 162 serves a similar function as does secondary key 162 in relation to shift mode 91 or as does secondary key 161 in relation to symbol mode 92. And similarly, in this case, the output codes 12 associated with FUNCTIONS 10–12 are generated only if secondary key 162 remains depressed. It is understood that, if the selector switch 100 is in the left-hand operation, the following concurrent depression of the keys, 20 and 30, will generate the identical output codes 12 and functions 15:

secondary key 159+secondary key 162+primary key 156-"FUNCTION 10";
secondary key 159+secondary key 161+primary key 156-"FUNCTION 11"; and
secondary key 159+secondary key 162+primary key 157-"FUNCTION 12".

In the preferred embodiment and as shown in FIG. 12A, when number mode 93 is activated and when selector switch 100 is on the right hand operation, assignment means 200 is pre-programmed so that the concurrent depression of each primary key 20 with the secondary key 160 generates output codes 12 which are associated with the following specific characters 14 or functions 15 (function are underlined):

primary key 150+secondary key 160-"END";
primary key 151+secondary key 160-"+";

primary key 152+secondary key 160-"INT ";
primary key 153+secondary key 160-"(E)";
primary key 154+secondary key 160-"UP ARROW";
primary key 155+secondary key 160-"(3)";
primary key 156+secondary key 160-"LEFT ARROW";
primary key 157+secondary key 160-"DOWN ARROW"; and,
primary key 158+secondary key 160-"RIGHT ARROW".

It is understood that, if the selector switch 100 is in the left-hand operation, the concurrent depression of the primary keys 20 as described above with secondary key 161 will generate the identical output codes 12 and characters 14 or functions 15.

In the preferred embodiment and as shown in FIG. 12A, when number mode 93 is activated and when selector switch 100 is on the right hand operation, assignment means 200 is pre-programmed so that the concurrent depression of each primary key 20 with the secondary key 159 generates output codes 12 which are associated with the following specific characters 14 or functions 15 (functions are underlined):

primary key 150+secondary key 159-"HOME";
primary key 151+secondary key 159-"-";
primary key 152+secondary key 159-"/";
primary key 153+secondary key 159-"%";
primary key 154+secondary key 159-"PAGE UP";
primary key 155+secondary key 159-"$";
primary key 156+secondary key 159-"0";
primary key 157+secondary key 159-"PAGE DOWN"; and,
primary key 158+secondary key 159-".".

It is understood that, if the selector switch 100 is in the left-hand operation, the concurrent depression of the primary keys 20 as described above with secondary key 162 will generate the identical output codes 12 and characters 14 or functions 15.

Also in the preferred embodiment and as shown in FIGS. 13A and 13B, assignment means 200 is pre-programmed so that the sequential concurrent depression of one secondary key 30 with another secondary key 30 generates output codes 12 at the release of the secondary key 30 depressed second in time. The output codes 12 generated by such depressions are associated with the following specific characters 14 or functions 15 (functions are underlined):

secondary key 159+secondary key 162-".";
secondary key 162+secondary key 159-"BACK SPACE";
secondary key 162+secondary key 160-"CAPS LOCK";
secondary key 159+secondary key 161-"DELETE";
secondary key 160+secondary key 162-"ESCAPE";
secondary key 160+secondary key 161-"INSERT";
secondary key 161+secondary key 160-"CONTROL"; and
secondary key 161+secondary key 159-"ALTERNATE".

It should be noted that some of the two secondary key 30 combinations also act as on/off toggle keys, providing the data entry system 10 with new primary and secondary codes, 22 and 32, until the combination is once again depressed. Such on/off toggle key combinations include the CAPS LOCK function (secondary keys 162 and 160), the INSERT function (secondary keys 160 and 161), the CONTROL function (secondary keys 161 and 160), and the ALTERNATE function (secondary keys 161 and 159). It is also understood that, if selector switch 100 is in the left-hand operation, the identical output codes 12 and characters 14 or functions 15 may be generated by depressing the following sequence of secondary keys 30:

secondary key 162+secondary key 159-".";
secondary key 159+secondary key 162-"BACK SPACE";
secondary key 159+secondary key 161-"CAPS LOCK";
secondary key 162+secondary key 160-"DELETE";
secondary key 161+secondary key 159-"ESCAPE";
secondary key 161+secondary key 160-"INSERT";
secondary key 160+secondary key 161-"CONTROL"; and
secondary key 160+secondary key 162-"ALTERNATE".

Preferably, the system 10 would automatically revert to its original functions after such an entry. Utilizing this system of entry, the user may efficiently enter the same alphabetic and textual data as may be entered with a conventional two handed keyboard.

Although the application describes the preferred embodiment of the invention, slight design variations may be made without departing from the scope and spirit of the invention. For example, additional function keys may be added as on a standard keyboard as well as additional keys that are commonly found on a keyboard. The common "mouse" function may also be easily added to the keyboard. The present disclosure incorporates only the essence of the preferred data entry system that provides the optimal efficiency.

I claim:

1. A data entry system operated with one hand, comprising:

a plurality of primary keys;

each of said plurality of primary keys capable of being depressed and released;

each of said plurality of primary keys generating a distinct primary code upon depression;

at least one secondary key;

each of said at least one secondary key capable of being depressed and released;

each of said at least one secondary key generating a distinct secondary code upon depression;

wherein the sum of each of said primary codes and each of said secondary codes is distinct from each such other sum and from each of said primary codes and each of said secondary codes;

wherein the sum of any two of said secondary codes is distinct from each such other sum and from each of said primary codes and each of said secondary codes;

a controller;

said controller in electrical communication with said keys;

said controller generating output codes;

said output codes generated by said controller depending on which of said primary and secondary codes are generated by the depression of said keys;

said controller transmitting characters or functions;

each of said output codes corresponding to one of said characters or functions so that the generation of one of said output codes results in the transmission of said corresponding character or function;

said controller generating said output codes and transmitting said characters or functions under four sets of circumstances;

said first set of circumstances occurring upon the release of a prior to depressed key, if no other of said keys is concurrently depressed;

wherein said output code generated by said controller is equivalent to said primary or secondary code generated by the depression of said released key;

said second set of circumstances occurring upon the concurrent depression of one of said plurality of primary keys and one of said at least one secondary key, regardless of which of said keys is depressed first in time;

wherein said output code generated by said controller is equivalent to the sum of said primary and secondary codes generated by said depressed primary and secondary keys;

said third set of circumstances occurring upon the concurrent depression of two of said plurality of primary keys;

wherein said output code generated by said controller is equivalent to said primary code generated by said primary key depressed first in time; and said fourth set of circumstances occurring upon the concurrent depression of two of said at least one secondary keys;

wherein said output code generated by said controller is equivalent to the sum of said secondary codes generated by said depressed secondary codes.

2. A data entry system as in claim 1, wherein said controller including a storing means, an output code generation means, a cancellation means, an assignment means, and a transmission means;

said storing means storing said primary and secondary codes generated by the depression of said keys;

said storing means concurrently storing no more than two of said primary and secondary codes;

said storing means in electrical communication with said output code generation means;

said output code generation means generating said output code;

said output code generated by said output code generation means depending on which of said primary and secondary codes are stored by said storing means;

said output code generation means comprising a release output code generation means, a non-sequential depression output code generation means, a primary sequential depression output code generation means, and a secondary sequential depression output code generation means;

said release output code generation means generating said output code when said storing means stores one of said primary or one of said secondary codes and said key generating said primary or secondary code is subsequently released, if no other of said keys is concurrently depressed;

wherein said output code generated by said release output code generation means is equivalent to said primary or secondary code stored by said storing means;

said non-sequential depression output code generation means generating said output code when said storing means stores one of said primary codes and one of said secondary codes, regardless of which of said codes is stored first in time;

wherein said output code generated by said non-sequential depression output code generation means is equivalent to the sum of said primary and secondary codes stored by said storing means;

said primary sequential depression output code generation means activated when said storing means stores two of said primary codes;

wherein said output code generated by said sequential depression output code generation means is equivalent to said primary code stored first in time by said storing means;

said secondary sequential depression output code generation means activated when said storing means stores two of said secondary codes;

wherein said output code generated by said sequential depression output code generation means is equivalent to the sum of said secondary codes stored by said storing means;

said output code generation means in electrical communication with said cancellation means;

said cancellation means canceling a determinative code from said storing means;

said determinative code comprising one of said primary or secondary codes stored by said storing means;

wherein the value of said determinative code depending on whether said output code is generated by said release output code generation means, said non-sequential depression output code generation means, said primary sequential depression output code generation means, or said secondary sequential depression output code generation means;

said output code generation means in electrical communication with said assignment means;

said assignment means assigning said corresponding character or function to said output code generated;

said assignment means in electrical communication with said transmission means; and said transmission means transmitting said character or function.

3. A data entry system as in claim 2, wherein said storing means comprising a first storing means, a second storing means, a first code identification means, a second code identification means, a key release detection means, and a timing sequence detection means;

said first storing means activated by the generation of one of said primary or secondary codes;

said first storing means storing said primary or secondary code generated;

said first code identification means activated once first storing means stores one of said primary or secondary codes;

said first code identification means identifying whether said primary or secondary code stored by said first storing means is one of said primary codes or one of said secondary codes;

said second storing means activated only if first storing means has already stored one of said primary or secondary codes;

said second storing means activated by the generation of one of said primary or secondary codes;

said second storing means storing said primary or secondary code generated;

said second code identification means activated once second storing means stores one of said primary or secondary codes;

said second code identification means identifying whether said primary or secondary code stored by said second storing means is one of said primary codes or one of said secondary codes;

said key release detection means detecting when only one of said primary or secondary codes is stored by said first and second storing means and subsequently said key generating said one stored primary or secondary code is released prior to a second of said primary or secondary codes being stored by said first and second storing means; and said timing sequence detection means detecting which of two of said codes being concurrently stored by said first and second storing means was stored first in time by said storing means.

4. A data entry system as in claim 3, wherein said release output code generation means generating said output code if said key release detection means is activated; and wherein said output code generated by said release output code generation means is equivalent to said primary or secondary code stored by said first and second storing means.

5. A data entry system as in claim 3, wherein said non-sequential depression output code generation means generating said output code if said first and second code identification means identify that said first and second storing means have stored one of said primary codes and one of said secondary codes and if key release detection means has not been activated; and wherein said output code generated by said non-sequential depression output code generation means is equivalent to the sum of said primary and secondary codes stored by said first and second storing means.

6. A data entry system as in claim 3, wherein said primary sequential depression output code generation means generating said output code if said first and second code identification means identify that said first and second storing means have each stored one of said primary codes and if said key release detection means has not been activated; and wherein said output code generated by said primary sequential depression output code generation means is equivalent to said primary code stored first in time by said first and second storing means, as detected by said timing sequence detection means.

7. A data entry system as in claim 3, wherein said secondary sequential depression output code generation means generating said output code if said first and second code identification means identify that said first and second storing means have each stored one of said secondary codes and if said key release detection means has not been activated; and wherein said output code generated by said secondary sequential depression output code generation means is equivalent to the sum of said secondary codes stored by said first and second storing means.

8. A data entry system as in claim 3, wherein said assignment means comprising an assignment reading means and an assignment allocation means;

said assignment reading means reading said output code generated by said output code generation means; and said assignment allocation means allocating said corresponding character or function to said generated output code.

9. A data entry system as in claim 3, wherein said cancellation means comprising a cancellation reading means and a cancellation identification means;

said cancellation reading means reading said output code generated by said output code generation means;

said cancellation identification means identifying said determinative code;

said cancellation identification means canceling said determinative code from said first and second storing means.

10. A data entry system as in claim 9, wherein said cancellation identification means identifying said determinative code depending on whether said output code is generated by said release output code generation means, said non-sequential depression output code generation means, said primary sequential depression output code generation means, or said secondary sequential depression output code generation means;

so that if said release output code generation means generates said output code, said cancellation identification means identifying that said determinative code is equivalent to said primary or secondary code stored by said first and second storing means;

so that if said non-sequential depression output code generation means generates said output code, said cancellation identification means identifying that said determinative code is equivalent to either said primary or secondary code stored by first and second storing means, depending on a pre-programmed instruction; and so that if said primary sequential depression output code generation means generates said output code, said cancellation identification means identifying that said determinative code is equivalent to said primary code stored first in time by said first or second storing means, as detected by said key release detection means; and so that if said secondary sequential depression output code generation means generates said output code, said cancellation identification means identifying that said determinative code is equivalent to said secondary code stored first in time by said first or second storing means, as detected by said key release detection means.

11. A data entry system as in claim 3, wherein said transmission means transmitting said character or function assigned to said output code by said assignment means.

12. A data entry system as in claim 11, wherein the activation of said storing means, said release output code generation means, said cancellation means, said assignment means, and said transmission means comprising a release transmission means;

the activation of said storing means, said non-sequential depression output code generation means, said cancellation means, said assignment means, and said transmission means comprising a non-sequential depression transmission means;

the activation of said storing means, said primary sequential depression output code generation means, said cancellation means, said assignment means, and said transmission means comprising a primary sequential depression transmission means; and the activation of said storing means, said secondary sequential depression output code generation means, said cancellation means, said assignment means, and said transmission means comprising a secondary sequential depression transmission means.

13. A keyboard as in claim 3, further comprising a plurality of modes;

each of said plurality of modes activated upon the generation of one of said output codes and corresponding functions;

each of said plurality of modes assigning each of said plurality of primary keys a distinct primary code and each of said at least one secondary key a distinct secondary code;

so that said keys generate distinct primary and secondary codes when each of said plurality of mode switches is activated.

14. A keyboard as in claim 13, wherein said plurality of modes comprising a shift mode;

a symbol mode; and a number mode.

15. A keyboard as in claim 14, wherein said plurality of primary keys comprising thirteen primary keys; and said at least one secondary key comprising one secondary key.

16. A keyboard as in claim 14, wherein said plurality of primary keys comprising nine primary keys; and said at least one secondary key comprising two secondary keys.

17. A keyboard as in claim 14, wherein said plurality of primary keys comprising nine primary keys; and said at least one secondary key comprising four secondary keys.

18. A keyboard as in claim 17, wherein each of said nine primary keys identically constructed;

said nine primary keys arranged in three aligned rows; and each of said three aligned rows containing three of said primary keys.

19. A keyboard as in claim 18, wherein each of said two secondary keys identically constructed;

said four secondary keys arranged in sets of two; and said sets positioned on either side of the bottom row of said primary keys.

* * * * *